US010388583B2

(12) United States Patent
Hoshiyama et al.

(10) Patent No.: US 10,388,583 B2
(45) Date of Patent: *Aug. 20, 2019

(54) THERMOSETTING RESIN COMPOSITION AND METHOD OF PRODUCING SAME

(71) Applicant: Namics Corporation, Niigata (JP)

(72) Inventors: Masaaki Hoshiyama, Niigata (JP); Toyokazu Hotchi, Niigata (JP); Toshiaki Enomoto, Niigata (JP)

(73) Assignee: NAMICS CORPORATION, Niigata (JP)

(*) Notice: Subject to any disclaimer, the term of this patent is extended or adjusted under 35 U.S.C. 154(b) by 12 days.

This patent is subject to a terminal disclaimer.

(21) Appl. No.: 15/517,742

(22) PCT Filed: Oct. 8, 2015

(86) PCT No.: PCT/JP2015/078580
§ 371 (c)(1),
(2) Date: Apr. 7, 2017

(87) PCT Pub. No.: WO2016/056619
PCT Pub. Date: Apr. 14, 2016

(65) Prior Publication Data
US 2017/0301597 A1 Oct. 19, 2017

(30) Foreign Application Priority Data
Oct. 10, 2014 (JP) ................. 2014-209207

(51) Int. Cl.
H01L 21/00 (2006.01)
H01L 23/29 (2006.01)
(Continued)

(52) U.S. Cl.
CPC ............... H01L 23/29 (2013.01); C08F 2/44 (2013.01); C08G 59/621 (2013.01);
(Continued)

(58) Field of Classification Search
CPC ..... H01L 21/563; H01L 23/29; H01L 23/293; H01L 23/295; H01L 24/83; C08F 2/44;
(Continued)

(56) References Cited

U.S. PATENT DOCUMENTS 8,389,328 B2    3/2013  Meura et al.
9,417,228 B2 *  8/2016  Enomoto ............. G01N 33/442
(Continued)

FOREIGN PATENT DOCUMENTS

JP    H05-337999 A    12/1993
JP    H08-15119 A      1/1996
(Continued)

OTHER PUBLICATIONS

International Search Report and Written Opinion for International Application No. PCT/JP2015/078580, dated Dec. 15, 2015, 12 pages.

Primary Examiner — Brooke Kebede
(74) Attorney, Agent, or Firm — Westman, Champlin & Koehler, P.A.

(57) ABSTRACT

Provided is a thermosetting resin composition, which can be used as underfill for obtaining favorable solder connectivity while suppressing the formation of voids in the case of treating under heating conditions required by the underfill in a semiconductor chip thermocompression bonding step using the thermal compression bonding technique. The thermosetting resin composition contains a thermosetting resin, a curing agent and a fluxing agent, and the temperature at which the rate of temperature change of viscosity when temperature is increased according to a prescribed heating profile reaches 30 Pa·s/° C. is 200° C. to 250° C.

7 Claims, 18 Drawing Sheets

(51) Int. Cl.

| | |
|---|---|
| *C08F 2/44* | (2006.01) |
| *C08K 5/3437* | (2006.01) |
| *C09J 11/06* | (2006.01) |
| *C08L 33/06* | (2006.01) |
| *C08L 63/04* | (2006.01) |
| *C08L 101/00* | (2006.01) |
| *H01L 23/00* | (2006.01) |
| *C08G 59/62* | (2006.01) |
| *H01L 21/56* | (2006.01) |
| *C08F 222/10* | (2006.01) |

(52) U.S. Cl.
CPC ............ *C08K 5/3437* (2013.01); *C08L 33/06* (2013.01); *C08L 63/04* (2013.01); *C08L 101/00* (2013.01); *C09J 11/06* (2013.01); *H01L 23/293* (2013.01); *H01L 24/83* (2013.01); *C08F 2222/1013* (2013.01); *H01L 21/563* (2013.01); *H01L 2224/16225* (2013.01); *H01L 2224/32225* (2013.01); *H01L 2224/73204* (2013.01); *H01L 2224/81815* (2013.01); *H01L 2224/83855* (2013.01); *H01L 2224/92125* (2013.01); *H01L 2924/181* (2013.01)

(58) Field of Classification Search
CPC ....... C08K 5/3437; C08L 33/06; C08L 63/04; C08L 101/00; C09J 11/06; C09J 163/00
USPC .................................................. 438/125–127
See application file for complete search history.

(56) References Cited

U.S. PATENT DOCUMENTS

| | | | |
|---|---|---|---|
| 2010/0044088 | A1 | 2/2010 | Watanabe et al. |
| 2011/0311790 | A1* | 12/2011 | Okada ........................ C09J 9/02 428/209 |
| 2012/0101191 | A1* | 4/2012 | Enomoto ............... H01L 23/295 523/466 |
| 2012/0156502 | A1 | 6/2012 | Maejima et al. |
| 2012/0199988 | A1 | 8/2012 | Meura et al. |
| 2014/0316102 | A1* | 10/2014 | Enomoto ............... G01N 33/442 528/421 |

FOREIGN PATENT DOCUMENTS

| | | |
|---|---|---|
| JP | 2012-238702 A | 12/2012 |
| JP | 2013-171927 A | 9/2013 |
| JP | 2014-55245 A | 3/2014 |
| JP | 2014-211363 A | 11/2014 |
| JP | 2015-137299 A | 7/2015 |
| JP | 2015-168691 A | 9/2015 |
| WO | 2008/004287 A1 | 1/2008 |
| WO | 2010/052871 A1 | 5/2010 |
| WO | 2011/033743 A1 | 3/2011 |
| WO | 2011/048774 A1 | 4/2011 |

* cited by examiner

Fig. 6(a)
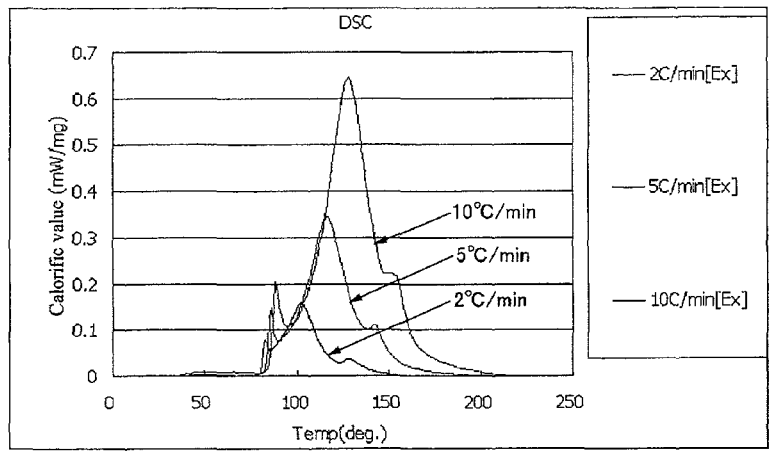
Reaction Rate Measurement Results
Fig. 6(b)
|  | Calorific value (mW/mg) | Percentage relative to average |
|---|---|---|
| 2°C/min | 127.1 | 92% |
| 5°C/min | 142.5 | 103% |
| 10°C/min | 145.9 | 105% |
| average | 138.5 |  |
Total Calorific Value for each Rate of Temperature Increase
Fig. 7
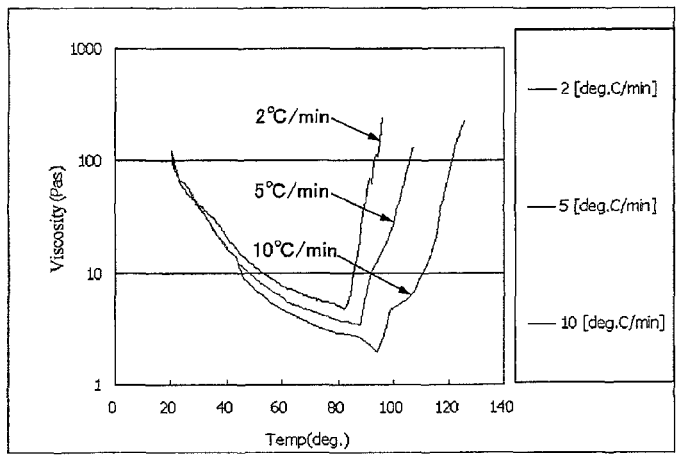
Temperature-Dependent Viscosity Measurement Results Time-Dependent Reaction Rate Temperature-Dependent Reaction Rate

Fig. 10

| Kamal model | input data |
|---|---|
| A1 | |
| A2 | |
| E1 | |
| E2 | |
| m | |
| n | |
| B1 | |
| B2 | |
| F1 | |
| F2 | |
| p | |
| q | |
| Tb | |
| T0 | 2.73E+02 |

List of Parameters Calculated according to Reaction Rate Fitting

Fig. 11(a)
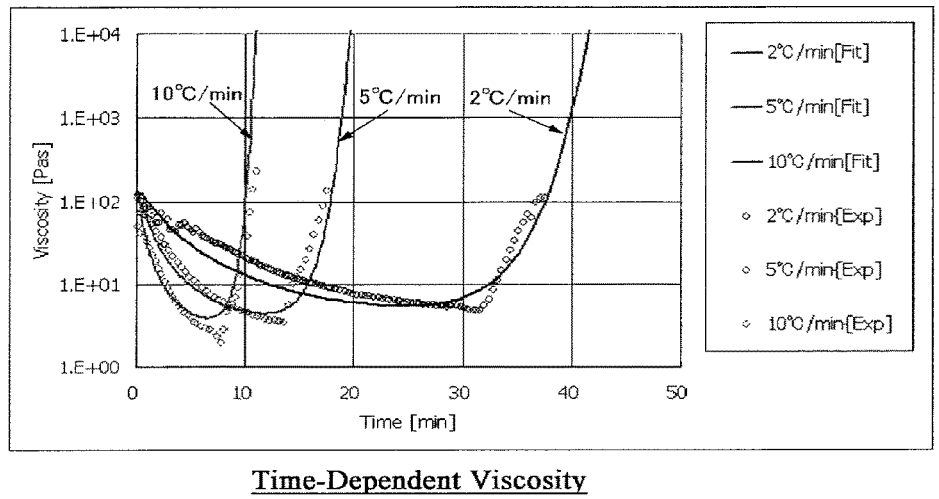
Time-Dependent Viscosity
Fig. 11(b)
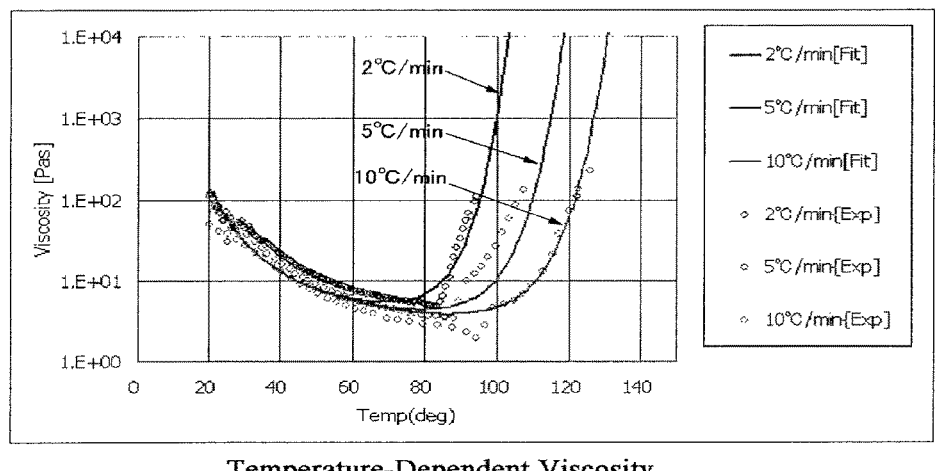
Temperature-Dependent Viscosity
Fig. 12
| Castro-Macosko model | input data |
|---|---|
| B | 1.71E+01 |
| TB | 1.13E+02 |
| tau* | 1.00E-10 |
| r | 9.00E-01 |
| omega[1/s] | 6.28E+00 |
| αgel | 9.00E-01 |
| E | 6.12E+00 |
| F | 4.41E+00 |
List of Parameters Calculated according to Viscosity Behavior Time-Dependent Viscosity Temperature-Dependent Viscosity Temperature-Dependent Viscosity Prediction Results Dispense Flux Mounting Reflow Flux cleaning Dispense Curing Dispense Bonding Post cure

| Time (sec) | Temperature (℃) | Time (sec) | Temperature (℃) | Time (sec) | Temperature (℃) |
|---|---|---|---|---|---|
| 0.0 | 144.9 | 2.1 | 169.8 | 4.1 | 243.9 |
| 0.1 | 146.0 | 2.2 | 174.0 | 4.2 | 245.3 |
| 0.2 | 146.9 | 2.3 | 178.1 | 4.3 | 246.6 |
| 0.3 | 147.7 | 2.4 | 182.7 | 4.4 | 247.7 |
| 0.4 | 148.4 | 2.5 | 187.5 | 4.5 | 248.7 |
| 0.5 | 149.0 | 2.6 | 192.6 | 4.6 | 249.7 |
| 0.6 | 149.6 | 2.7 | 197.9 | 4.7 | 250.6 |
| 0.7 | 150.2 | 2.8 | 203.2 | 4.8 | 251.4 |
| 0.8 | 150.7 | 2.9 | 208.5 | 4.9 | 252.1 |
| 0.9 | 151.2 | 3.0 | 213.8 | 5.0 | 252.8 |
| 1.0 | 151.7 | 3.1 | 218.4 | 5.1 | 253.4 |
| 1.1 | 152.1 | 3.2 | 222.5 | 5.2 | 254.0 |
| 1.2 | 152.6 | 3.3 | 226.0 | 5.3 | 254.7 |
| 1.3 | 153.0 | 3.4 | 229.1 | 5.4 | 255.3 |
| 1.4 | 153.4 | 3.5 | 231.9 | 5.5 | 255.8 |
| 1.5 | 153.9 | 3.6 | 234.5 | 5.6 | 256.3 |
| 1.6 | 154.4 | 3.7 | 236.8 | 5.7 | 256.8 |
| 1.7 | 155.8 | 3.8 | 238.8 | 5.8 | 257.3 |
| 1.8 | 158.2 | 3.9 | 240.7 | 5.9 | 257.7 |
| 1.9 | 161.7 | 4.0 | 242.4 | 6.0 | 258.1 |
| 2.0 | 165.6 | | | | |

THERMOSETTING RESIN COMPOSITION AND METHOD OF PRODUCING SAME

CROSS-REFERENCE TO RELATED APPLICATION

This Application is a Section 371 National Stage Application of International Application No. PCT/JP2015/078580, filed 8 Oct. 2015 and published as WO 2016/056619 A1 on 14 Apr. 2016, in Japanese, the contents of which are hereby incorporated by reference in their entirety.

TECHNICAL FIELD

The present invention relates to a thermosetting resin composition for encapsulating a semiconductor and a method of producing the same, and more particularly, to a thermosetting resin composition for pre-applied semiconductor encapsulation, and a method of producing the same.

BACKGROUND ART

A capillary flow technique using capillary underfill (CUF) shown in FIG. 17 is a known example of a conventional flip-chip mounting method. This capillary flow technique begins with the application of flux (FIG. 17(a)). Next, a semiconductor chip such as an IC chip provided with a solder layer is placed on the flux (FIG. 17(b)). Subsequently, reflow soldering is carried out (FIG. 17(c)). Continuing, excess flux is cleaned off (FIG. 17(d)). Next, underfill is allowed to flow into the gap between the chip and substrate using capillary phenomenon (FIG. 17(e)). Finally, the underfill is thermoset by heat treatment (FIG. 17(f)).

However, in the case of this capillary flow technique, it is essential to use flux in addition to underfill. In addition, a flux application step (FIG. 17(a)) and flux cleaning step (FIG. 17(d)) are required. Consequently, in this capillary flow technique, it was not possible to efficiently mount a semiconductor chip. In the cleaning step (FIG. 17(d)) in particular, there were cases in which excess flux was unable to be completely washed off.

Thermal compression bonding (TCB), which uses a pre-applied underfill material (PAM) as shown in FIG. 18, is employed as a flip-chip mounting method that does not use flux application or flux cleaning steps. In this technique, a pre-applied type of underfill such as a non-conductive paste (NCP) is first applied to a substrate terminal (FIG. 18(a)). Next, a semiconductor chip provided with a solder ball is thermocompression bonded on the underfill (FIG. 18(b)). In addition to melting the solder ball of the semiconductor chip, this thermocompression bonding causes primary curing of the underfill. Subsequently, the underfill is subjected to secondary curing by undergoing heat treatment (FIG. 18(c)).

This thermal compression bonding technique requires only the three steps of applying the underfill, thermocompression bonding the semiconductor chip, and heat treatment, without using flux. Consequently, a semiconductor chip can be mounted efficiently.

In addition, Patent Document 2 describes a pre-applied semiconductor encapsulating film used in flip-chip mounting that comprises: (A) a liquid epoxy resin, (B) a thermoplastic resin, (C) a curing agent, (D) a latent curing accelerator subjected to heat treatment at 50° C. to 100° C., and (E) an inorganic filler.

PRIOR ART DOCUMENTS

Patent Documents

Patent Document 1: JP H8-15119 A (1996)
Patent Document 2: JP 2014-55245 A

DISCLOSURE OF THE INVENTION

Problems to be Solved by the Invention

In the aforementioned thermal compression bonding technique, there was the problem of it being difficult to realize both suppression of void formation in the underfill and favorable solder connectivity in the semiconductor chip thermocompression bonding step shown in FIG. 18(b)).

Namely, if the viscosity of the primarily cured underfill is excessively low in the semiconductor chip thermocompression bonding step shown in FIG. 18(b)), generation of outgas is unable to be suppressed resulting in increased susceptibility to the formation of voids. Consequently, in the semiconductor chip thermocompression bonding step, whether or not outgas is generated is determined by the magnitude of the viscosity of the underfill. Voids end up forming in the case outgas is generated.

Conversely, if the viscosity of the underfill is excessively high in the semiconductor chip thermocompression bonding step shown in FIG. 18(b)), connection between the solder ball and substrate terminal is impaired by the underfill. The underfill preferably demonstrates viscosity behavior such that it does not increase in viscosity until the solder melts and spreads out. If the underfill starts to increase in viscosity before the solder melts and spreads out, the spread of the molten solder ends up being impaired resulting in a defective connection.

At present, heating conditions required by underfill in the case of a mounting tact of 4 seconds, for example, consist of a temperature increase of up to 260° C. at the rate of 1800° C./minute (approximately 30° C./second). In the case of these heating conditions, voids end up forming in the case of current underfill compositions. It is thought to be advantageous that the resin have high viscosity in the vicinity of a solder melting temperature of 220° C. in order to suppress the formation of voids.

In the thermal compression bonding technique, the underfill is required to have a composition that demonstrates viscosity behavior so as to realize both suppression of void formation and solder connectivity. Under the present circumstances, however, there is currently no means for measuring the viscosity behavior of underfill by following temperature behavior in the semiconductor chip mounting step (such as temperature behavior during the aforementioned temperature increase at the rate of 1800° C./minute). Consequently, conventional methods were only able to predict viscosity behavior on the basis of temperature-dependent viscosity data by measuring an evaluation sample in the form of a non-conductive paste with a rheometer at a rate of temperature increase of 3° C./minute. In the case of these methods, however, the formation of voids was unable to be suppressed. In addition, the viscosity behavior of underfill at a rate of temperature increase that is compatible with the semiconductor chip mounting step (such as the aforementioned temperature increase at the rate of 1800° C./minute) was conventionally unable to be predicted. Consequently, in a semiconductor chip thermocompression bonding step using the thermal compression bonding technique, it was difficult to obtain underfill capable of suppressing void formation in the case of treating under heating conditions required by the underfill.

With the foregoing in view, an object of the present invention is to provide a thermosetting resin composition, and production method thereof, which can be used as underfill for obtaining favorable solder connectivity while suppressing the formation of voids in the case of treating under heating conditions required by the underfill in a semiconductor chip thermocompression bonding step using the thermal compression bonding technique.

Means for Solving the Problems

The present invention employs the configurations indicated below in order to achieve the aforementioned object. The present invention is a thermosetting resin composition characterized by the following Configurations 1 to 14. In addition, the present invention is a method of producing a thermosetting resin composition characterized by the following Configurations 15 to 25.

(Configuration 1)

Configuration 1 of the present invention is a thermosetting resin composition containing a thermosetting resin, a curing agent and a fluxing agent, wherein the temperature at which the rate of temperature change of viscosity when temperature is increased according to a prescribed heating profile reaches 30 Pa·s/° C. is 200° C. to 250° C.

The thermosetting resin composition of the present invention can be used as underfill for obtaining favorable solder connectivity while suppressing the formation of voids in the case of treating under heating conditions required by the underfill.

(Configuration 2)

Configuration 2 of the present invention is the thermosetting resin composition described in Configuration 1, wherein the thermosetting resin is a phenol novolac-type epoxy resin and/or (meth)acrylate compound.

According to Configuration 2 of the present invention, suppression of void formation can be suppressed more reliably and more favorable solder connectivity can be obtained by using a phenol novolac-type epoxy resin and/or (meth)acrylate compound for the thermosetting resin.

[Configuration 3]

Configuration 3 of the present invention is the thermosetting resin composition described in Configuration 1 or Configuration 2, wherein the prescribed heating profile is a heating profile consisting of increasing the temperature from 145° C. to 258° C. in 6 seconds.

According to Configuration 3 of the present invention, since the prescribed heating profile can be made to be a profile that is close to the actual heating profile, in the case of treating under heating conditions required by the underfill, a thermosetting resin composition can be obtained that can be used as underfill for obtaining favorable solder connectivity while suppressing the formation of voids.

(Configuration 4)

Configuration 4 of the present invention is the thermosetting resin composition described in Configuration 3, wherein the prescribed heating profile is a heating profile comprising increasing the temperature from 145° C. to 152° C. in 1 second followed by increasing the temperature from 152° C. to 253° C. in 4 seconds.

According to Configuration 4 of the present invention, since the prescribed heating profile can be made to be a profile that is closer to the actual heating profile, in the case of treating under heating conditions required by the underfill, a thermosetting resin composition can be obtained that can be used as underfill for obtaining more favorable solder connectivity while more effectively suppressing the formation of voids.

(Configuration 5)

Configuration 5 of the present invention is the thermosetting resin composition described in Configurations 1 to 4, wherein the thermosetting resin composition is a thermosetting resin composition for semiconductor encapsulation.

The thermosetting resin composition of the present invention can be used as underfill for obtaining favorable solder connectivity while suppressing the formation of voids in the case of treating under heating conditions required by the underfill in a semiconductor chip thermocompression bonding step using a thermal compression bonding technique. Consequently, the thermosetting resin composition of the present invention can be used as a thermosetting resin composition for semiconductor encapsulation.

(Configuration 6)

Configuration 6 of the present invention is the thermosetting resin composition described in any of Configurations 1 to 5, wherein the thermosetting resin composition is a film-like thermosetting resin composition further containing a film forming agent.

The thermosetting resin composition of Configuration 6 of the present invention can be made to be a film-like thermosetting resin composition by further containing a film forming agent. Consequently, underfill having the thermosetting resin composition of the present invention as a material thereof can be easily arranged at a prescribed location in a semiconductor chip thermocompression bonding step using a thermal compression bonding technique.

(Configuration 7)

Configuration 7 of the present invention is the thermosetting resin composition described in any of Configurations 1 to 6, wherein the rate of temperature change of viscosity when increasing the temperature according to a prescribed heating profile is the rate of temperature change of viscosity obtained by a method of predicting viscosity behavior, and the method of predicting viscosity behavior comprises prescribed steps. More specifically, the method of predicting viscosity behavior in Configuration 7 of the present invention comprises the following steps. The method of predicting viscosity behavior of the present invention comprises a reaction rate measurement step for respectively measuring calorimetry peaks of the thermosetting resin composition at three or more rates of temperature increase. The method of predicting viscosity behavior of the present invention comprises a viscosity behavior measurement step for respectively measuring viscosity behavior of the thermosetting resin composition at three or more rates of temperature increase. The method of predicting viscosity behavior of the present invention comprises a reaction rate fitting step for fitting measurement data for each rate of temperature increase obtained in the reaction rate measurement step to a Kamal model formula, obtaining a fitting curve of calorimetry and time and a fitting curve of the calorimetry and temperature of the thermosetting resin composition for each of the rates of temperature increase, and calculating parameters in the Kamal model formula determined by the materials of the thermosetting resin composition. The method of predicting viscosity behavior of the present invention comprises a viscosity behavior fitting step for fitting the parameters of the Kamal model formula calculated in the reaction rate fitting step and the measurement data for each of the rates of temperature increase obtained in the viscosity behavior measurement step to a Castro-Macosko model formula, obtaining a fitting a curve of viscosity and time and a fitting curve of viscosity and temperature of the thermosetting resin composition for each of the rates of temperature increase, and calculating parameters in the Castro-Macosko model formula determined by the materials of the thermosetting resin composition. The method of predicting viscosity behavior of the present invention comprises a virtual viscosity behavior calculation step for calculating virtual viscosity behavior of the thermosetting resin composition for a prescribed heating profile by simulation based on each fitting curve for each of the rates of temperature increase obtained in the viscosity behavior fitting step. The method of predicting viscosity behavior of the present invention comprises a viscosity temperature change rate calculation step for calculating the rate of temperature change of viscosity of the thermosetting resin composition for a prescribed heating profile from virtual viscosity behavior of the thermosetting resin composition, and determining the temperature at which the rate of temperature change of viscosity becomes 30 Pa·sec/° C.

According to Configuration 7 of the present invention, rate of temperature change of viscosity can be predicted by a prescribed method of predicting viscosity behavior when the thermosetting resin composition has been increased in temperature according to a prescribed heating profile. Consequently, even in the case of the absence of a means for measuring viscosity behavior of underfill that follows temperature behavior in a semiconductor chip mounting step, the rate of temperature change of viscosity when increased in temperature according to a prescribed heating profile can be obtained. As a result, a thermosetting resin composition can be obtained that can be used as underfill for obtaining favorable solder connectivity while suppressing the formation of voids.

(Configuration 8)

Configuration 8 of the present invention is the thermosetting resin composition described in Configuration 7, wherein the reaction rate measurement step includes measurement of a calorimetry peak of the thermosetting resin composition with a differential scanning calorimetry measuring device.

As a result of measuring a calorimetry peak of the thermosetting resin composition with a differential scanning calorimetry measuring device, the rate of temperature change of viscosity of the thermosetting resin composition when increased in temperature according to a prescribed heating profile can be reliably predicted by a prescribed method of predicting viscosity behavior.

(Configuration 9)

Configuration 9 of the present invention is the thermosetting resin composition described in Configuration 7 or 8, wherein the viscosity behavior measurement step includes measurement of viscosity behavior of the thermosetting resin composition with a viscoelasticity measuring device.

As a result of measuring viscosity behavior of the thermosetting resin composition with a viscoelasticity measuring device in the viscosity behavior measurement step, the rate of temperature change of viscosity of the thermosetting resin composition when increased in temperature according to a prescribed heating profile can be predicted more reliably by a prescribed method of predicting viscosity behavior.

(Configuration 10)

Configuration 10 of the present invention is the thermosetting resin composition described in any of Configurations 7 to 9, wherein the Kamal model formula used in the reaction rate fitting step is the modified Kamal model formula of the following Equation (2) in which the Kamal model formula of the following Equation (1) has been doubly superimposed:

$$\frac{\Delta \alpha(T)}{\Delta t} = \left(A_1 \exp\left(-\frac{E_1}{T+273.15}\right) + A_2 \exp\left(-\frac{E_2}{T+273.15}\right)\alpha(t)^m\right)(1-\alpha(t))^n \quad (1)$$

(wherein, $A_1$, $E_1$, $A_2$, $E_2$, m and n are parameters determined according to the materials of the thermosetting resin composition);

$$\frac{d\alpha(t)}{dt} = \left(A_1 \exp\left(-\frac{E_1}{T(t)}\right) + A_2\exp\left(-\frac{E_2}{T(t)}\right)\alpha(t)^m\right)(1-\alpha(t))^n \times \quad (2)$$
$$\frac{1}{1+\exp[T(t)-T_b]} + \left(B_1\exp\left(-\frac{F_1}{T(t)}\right) + B_2\exp\left(-\frac{F_2}{T(t)}\right)\alpha(t)^p\right)$$
$$(1-\alpha(t))^q \times \frac{1}{1+\exp[-(T(t)-T_b)]}$$

(wherein, $A_1$, $E_1$, $A_2$, $E_2$, m, n, $B_1$, $F_1$, $B_2$, $F_2$, p, q and $T_b$ are parameters determined by the materials of the thermosetting resin composition).

As a result of using the modified Kamal model formula in the reaction rate fitting step, the rate of temperature change of viscosity of the thermosetting resin composition when increased in temperature according to a prescribed heating profile can be more reliably predicted by a prescribed method of predicting viscosity behavior.

(Configuration 11)

Configuration 11 of the present invention is the thermosetting resin composition described in any of Configurations 7 to 10, wherein the three or more rates of temperature increase comprise at least 2° C./min, 5° C./min and 10° C./min.

As a result of using the three rates of temperature increase of 2° C./min, 5° C./min and 10° C./min in the reaction rate measurement step and viscosity behavior measurement step, the rate of temperature change of viscosity of the thermosetting resin composition when increased in temperature according to a prescribed heating profile can be more reliably predicted by a prescribed method of predicting viscosity behavior.

(Configuration 12)

Configuration 12 of the present invention is the thermosetting resin composition described in any of Configurations 1 to 11, wherein the thermosetting resin composition further contains at least one member of the group consisting of a curing accelerator, elastomer, filler and coupling agent.

As a result of the thermosetting resin composition of the present invention further containing at least one member selected from the group consisting of a curing accelerator, elastomer, filler and coupling agent, a thermosetting resin composition can be easily obtained in which the temperature at which the rate of temperature change of viscosity when increased in temperature according to a prescribed heating profile reaches 30 Pa·s/° C. is 200° C. to 250° C. As a result, in the case of treating under heating conditions required by underfill, a thermosetting resin composition can be reliably obtained that can be used as underfill for obtaining favorable solder connectivity while suppressing the formation of voids.

(Configuration 13)

Configuration 13 of the present invention is the thermosetting resin composition described in any of Configurations 1 to 12, wherein the thermosetting resin is a phenol novolac-type epoxy resin, and the thermosetting resin composition further comprises a liquid epoxy resin.

As a result of the epoxy resin contained in the thermosetting resin composition of the present invention further including a liquid epoxy resin in addition to a phenol novolac-type epoxy resin, a thermosetting resin composition can be more easily obtained in which the temperature at which the rate of temperature change of viscosity when increased in temperature according to a prescribed heating profile reaches 30 Pa·s/° C. is 200° C. to 250° C. As a result, in the case of treating under heating conditions required by underfill, a thermosetting resin composition can be more reliably obtained that can be used as underfill for obtaining favorable solder connectivity while suppressing the formation of voids.

(Configuration 14)

Configuration 14 of the present invention is thermosetting resin composition described in Configuration 13, wherein the thermosetting resin is a phenol novolac-type epoxy resin, and the thermosetting resin composition contains 20 parts by weight to 120 parts by weight of a film forming agent, 30 parts by weight to 100 parts by weight of a curing agent, 3 parts by weight to 20 parts by weight of an elastomer, 5 parts by weight to 50 parts by weight of a liquid epoxy resin, 50 parts by weight to 1000 parts by weight of a filler, 1 part by weight to 10 parts by weight of a coupling agent, 5 parts by weight to 100 parts by weight of a fluxing agent, and 5 parts by weight to 100 parts by weight of a curing accelerator based on 100 parts by weight of the phenol novolac-type epoxy resin.

As a result of the thermosetting resin composition of the present invention containing materials of a prescribed composition, a thermosetting resin composition can be obtained in which the temperature at which the rate of temperature change of viscosity when increased in temperature according to a prescribed heating profile reaches 30 Pa·s/° C. is 200° C. to 250° C. As a result, in the case of treating under heating conditions required by underfill, a thermosetting resin composition can be more reliably obtained that can be used as underfill for obtaining favorable solder connectivity while suppressing the formation of voids.

(Configuration 15)

Configuration 15 of the present invention is a method of producing a film-like thermosetting resin composition for encapsulating a semiconductor that contains a thermosetting resin, a curing agent, a fluxing agent and a film forming agent. The production method of the present invention comprises a step for selecting materials for a thermosetting resin composition containing a thermosetting resin, a curing agent, a fluxing agent and a film forming agent. The production method of the present invention comprises a step for mixing the materials for the thermosetting resin composition. In the production method of the present invention, the step for selecting materials for a thermosetting resin composition comprises the selection of materials for a thermosetting resin composition such that the temperature at which the rate of temperature change of viscosity when increased in temperature according to a prescribed heating profile reaches 30 Pa·s/° C. is 200° C. to 250° C.

According to Configuration 15 of the present invention, in the case of treating under heating conditions required by underfill in a semiconductor chip thermocompression bonding step using a thermal compression bonding technique, a method can be obtained for producing a thermosetting resin composition that can be used as underfill for obtaining favorable solder connectivity while suppressing the formation of voids.

(Configuration 16)

Configuration 16 of the present invention is the method of producing a thermosetting resin composition described in Configuration 15, wherein the thermosetting resin is a phenol novolac-type epoxy resin and/or (meth)acrylate compound.

According to Configuration 16 of the present invention, as a result of the thermosetting resin being a phenol novolac-type epoxy resin and/or (meth)acrylate compound, the formation of voids can be more reliably suppressed. As a result, more favorable solder connectivity can be obtained.

(Configuration 17)

Configuration 17 of the present invention is the method producing a thermosetting resin composition described in Composition 15 or 16, wherein the prescribed heating profile is a heating profile consisting of increasing the temperature from 145° C. to 258° C. in 6 seconds.

According to Configuration 17 of the present invention, since the prescribed heating profile can be made to be a profile that is close to the actual heating profile, in the case of treating under heating conditions required by the underfill, a method can be obtained for producing a thermosetting resin composition that can be used as underfill for obtaining favorable solder connectivity while suppressing the formation of voids.

(Configuration 18)

Configuration 18 of the present invention is the method of producing a thermosetting resin composition described in Configuration 17, wherein the prescribed heating profile is a heating profile comprising increasing the temperature from 145° C. to 152° C. in 1 second followed by increasing the temperature from 152° C. to 253° C. in 4 seconds.

According to Configuration 18 of the present invention, the prescribed heating profile can be made to be a profile that is closer to the actual heating profile. Consequently, in the case of treating under heating conditions required by the underfill, a method can be obtained for obtaining a thermosetting resin composition that can be used as underfill for obtaining more favorable solder connectivity while more effectively suppressing the formation of voids.

(Configuration 19)

Configuration 19 of the present invention is the method of producing a thermosetting resin composition described in any of Configurations 15 to 18, wherein the rate of temperature change of viscosity when increasing the temperature according to a prescribed heating profile is the rate of temperature change of viscosity obtained by a method of predicting viscosity behavior, and the method of predicting viscosity behavior comprises prescribed steps. More specifically, the method of predicting viscosity behavior (prescribed method of predicting viscosity behavior) in Configuration 19 of the present invention comprises a reaction rate measurement step for respectively measuring calorimetry peaks of the thermosetting resin composition at three or more rates of temperature increase. The prescribed method of predicting viscosity behavior comprises a viscosity behavior measurement step for respectively measuring viscosity behavior of the thermosetting resin composition at three or more rates of temperature increase. The prescribed method of predicting viscosity behavior comprises a reaction rate fitting step for fitting measurement data for each rate of temperature increase obtained in the reaction rate measurement step to a Kamal model formula, obtaining a fitting curve of calorimetry and time and a fitting curve of the calorimetry and temperature of the thermosetting resin composition for each of the rates of temperature increase, and calculating parameters in the Kamal model formula determined by the materials of the thermosetting resin composition. The prescribed method of predicting viscosity behavior comprises a viscosity behavior fitting step for fitting the parameters of the Kamal model formula calculated in the reaction rate fitting step and the measurement data for each of the rates of temperature increase obtained in the viscosity behavior measurement step to a Castro-Macosko model formula, obtaining a fitting a curve of viscosity and time and a fitting curve of viscosity and temperature of the thermosetting resin composition for each of the rates of temperature increase, and calculating parameters in the Castro-Macosko model formula determined by the materials of the thermosetting resin composition. The prescribed method of predicting viscosity behavior comprises a virtual viscosity behavior calculation step for calculating virtual viscosity behavior of the thermosetting resin composition for a prescribed heating profile by simulation based on each fitting curve for each of the rates of temperature increase obtained in the viscosity behavior fitting step. The prescribed method of predicting viscosity behavior comprises a viscosity temperature change rate calculation step for calculating the rate of temperature change of viscosity of the thermosetting resin composition for a prescribed heating profile from virtual viscosity behavior of the thermosetting resin composition, and determining the temperature at which the rate of temperature change of viscosity becomes 30 Pa·sec/° C.

According to Configuration 19 of the present invention, rate of temperature change of viscosity can be predicted by a prescribed method of predicting viscosity behavior when the thermosetting resin composition has been increased in temperature according to a prescribed heating profile. Consequently, even in the case of the absence of a means for measuring viscosity behavior of underfill that follows temperature behavior in a semiconductor chip mounting step, the rate of temperature change of viscosity when increased in temperature according to a prescribed heating profile can be obtained. As a result, a thermosetting resin composition can be produced that can be used as underfill for obtaining favorable solder connectivity while suppressing the formation of voids.

(Configuration 20)

Configuration 20 of the present invention is the method of producing a thermosetting resin composition described in Configuration 19, wherein the reaction rate measurement step of the method of predicting viscosity behavior includes measurement of a calorimetry peak of the thermosetting resin composition with a differential scanning calorimetry measuring device.

As a result of measuring a calorimetry peak of the thermosetting resin composition with a differential scanning calorimetry measuring device, the rate of temperature change of viscosity of the thermosetting resin composition when increased in temperature according to a prescribed heating profile can be reliably predicted by a prescribed method of predicting viscosity behavior.

(Configuration 21)

Configuration 21 of the present invention is the method of producing a thermosetting resin composition described in Configuration 19 or 20, wherein the viscosity behavior measurement step includes measurement of viscosity behavior of the thermosetting resin composition with a viscoelasticity measuring device.

As a result of measuring viscosity behavior of the thermosetting resin composition with a viscoelasticity measuring device in the viscosity behavior measurement step, the rate of temperature change of viscosity of the thermosetting resin composition when increased in temperature according to a prescribed heating profile can be predicted more reliably by a prescribed method of predicting viscosity behavior.

(Configuration 22)

Configuration 22 of the present invention is the method of producing a thermosetting resin composition described in any of Configurations 19 to 21, wherein the Kamal model formula used in the reaction rate fitting step is the modified Kamal model formula of the following Equation (2) in which the Kamal model formula of the following Equation (1) has been doubly superimposed:

$$\frac{\Delta \alpha(T)}{\Delta t} = \left(A_1 \exp\left(-\frac{E_1}{T+273.15}\right) + A_2 \exp\left(-\frac{E_2}{T+273.15}\right)\alpha(t)^m\right)(1-\alpha(t))^n \quad (1)$$

(wherein, $A_1$, $E_1$, $A_2$, $E_2$, m and n are parameters determined according to the materials of the thermosetting resin composition);

$$\frac{d\alpha(t)}{dt} = \left(A_1 \exp\left(-\frac{E_1}{T(t)}\right) + A_2 \exp\left(-\frac{E_2}{T(t)}\right)\alpha(t)^m\right)(1-\alpha(t))^n \times \quad (2)$$
$$\frac{1}{1+\exp[T(t)-T_b]} + \left(B_1 \exp\left(-\frac{F_1}{T(t)}\right) + B_2 \exp\left(-\frac{F_2}{T(t)}\right)\alpha(t)^p\right)$$
$$(1-\alpha(t))^q \times \frac{1}{1+\exp[-(T(t)-T_b)]}$$

(wherein, $A_1$, $E_1$, $A_2$, $E_2$, m, n, $B_1$, $F_1$, $B_2$, $F_2$, p, q and $T_b$ are parameters determined by the materials of the thermosetting resin composition).

As a result of using the modified Kamal model formula in the reaction rate fitting step, the rate of temperature change of viscosity of the thermosetting resin composition when increased in temperature according to a prescribed heating profile can be more reliably predicted by a prescribed method of predicting viscosity behavior.

(Configuration 23)

Configuration 23 of the present invention is the method of producing a thermosetting resin composition described in any of Configurations 19 to 22, wherein the three or more rates of temperature increase comprise at least 2° C./min, 5° C./min and 10° C./min.

As a result of using the three rates of temperature increase of 2° C./min, 5° C./min and 10° C./min in the reaction rate measurement step and viscosity behavior measurement step, the rate of temperature change of viscosity of the thermosetting resin composition when increased in temperature according to a prescribed heating profile can be more reliably predicted by a prescribed method of predicting viscosity behavior.

(Configuration 24)

Configuration 24 of the present invention is the method of producing a thermosetting resin composition described in any of Configurations 15 to 23, wherein the thermosetting resin composition further contains a film forming agent and at least one member of the group consisting of a curing accelerator, elastomer, filler and coupling agent.

As a result of the thermosetting resin composition of the present invention further containing at least one member selected from the group consisting of a curing accelerator, elastomer, filler and coupling agent, in the case of treating under heating conditions required by underfill, a thermosetting resin composition can be reliably produced that can be used as underfill for obtaining favorable solder connectivity while suppressing the formation of voids.

(Configuration 25)

Configuration 25 of the present invention is the method of producing a thermosetting resin composition described in any of Configurations 15 to 24, wherein the thermosetting resin composition further comprises a liquid epoxy resin.

As a result of the epoxy resin contained in the thermosetting resin composition of the present invention further including a liquid epoxy resin in addition to a phenol novolac-type epoxy resin, in the case of treating under heating conditions required by underfill, a thermosetting resin composition can be more reliably produced that can be used as underfill for obtaining favorable solder connectivity while suppressing the formation of voids.

(Configuration 26)

Configuration 26 of the present invention is the method of producing a thermosetting resin composition described in Configuration 25, wherein the thermosetting resin composition contains 20 parts by weight to 120 parts by weight of a film forming agent, 30 parts by weight to 100 parts by weight of a curing agent, 3 parts by weight to 20 parts by weight of an elastomer, 5 parts by weight to 50 parts by weight of a liquid epoxy resin, 50 parts by weight to 1000 parts by weight of a filler, 1 part by weight to 10 parts by weight of a coupling agent, 5 parts by weight to 100 parts by weight of a fluxing agent, and 5 parts by weight to 100 parts by weight of a curing accelerator based on 100 parts by weight of the phenol novolac-type epoxy resin.

As a result of the thermosetting resin composition containing materials of a prescribed composition, in the case of treating under heating conditions required by underfill, a thermosetting resin composition can be more reliably produced that can be used as underfill for obtaining favorable solder connectivity while suppressing the formation of voids.

Effects of the Invention

According to the present invention, in the case of treating under heating conditions required by underfill in a semiconductor chip thermocompression bonding step by a thermal compression bonding technique, a thermosetting resin composition, and a production method thereof, can be obtained that can be used as underfill for obtaining favorable solder connectivity while suppressing the formation of voids.

BRIEF DESCRIPTION OF THE DRAWINGS

FIG. 6(a) is a graph showing measurement results of the aforementioned reaction rate measurement step, while FIG. 6(b) is a table showing measurement results for each rate of temperature increase.

FIG. 7 is a graph showing measurement results of the aforementioned viscosity behavior measurement step.

FIG. 10 is a list showing parameters of a modified Kamal model formula calculated according to the results of the aforementioned reaction rate fitting step.

FIG. 11(a) is a graph showing actual viscosity and time measurement data of the aforementioned thermosetting resin composition obtained in the aforementioned viscosity behavior measurement step and fitting curves obtained in the aforementioned viscosity behavior fitting step. FIG. 11(b) is a graph showing actual viscosity and time measurement data of the aforementioned thermosetting resin composition obtained in the aforementioned viscosity behavior measurement step and fitting curves obtained in the aforementioned viscosity behavior fitting step.

FIG. 12 is a list showing parameters of a Castro-Macosko model formula calculated according to the results of the aforementioned reaction rate fitting step.

FIG. 15 indicates a comparison of actual measured values in the aforementioned virtual viscosity behavior calculation step when setting the rate of temperature increase to 3° C./min and fitting curves of predicted virtual viscosity behavior.

C./min and 3000° C./min in the aforementioned virtual viscosity behavior calculation step.

FIGS. 17(a) to 17(f) are schematic diagrams showing a series of steps of a capillary flow technique.

Figure 18A:
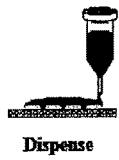
Figure 18B:
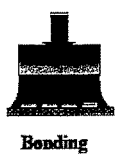
Figure 18C:

FIGS. 18(a) to 18(c) are schematic diagrams showing a series of steps of a thermal compression bonding technique.

Figure 19:
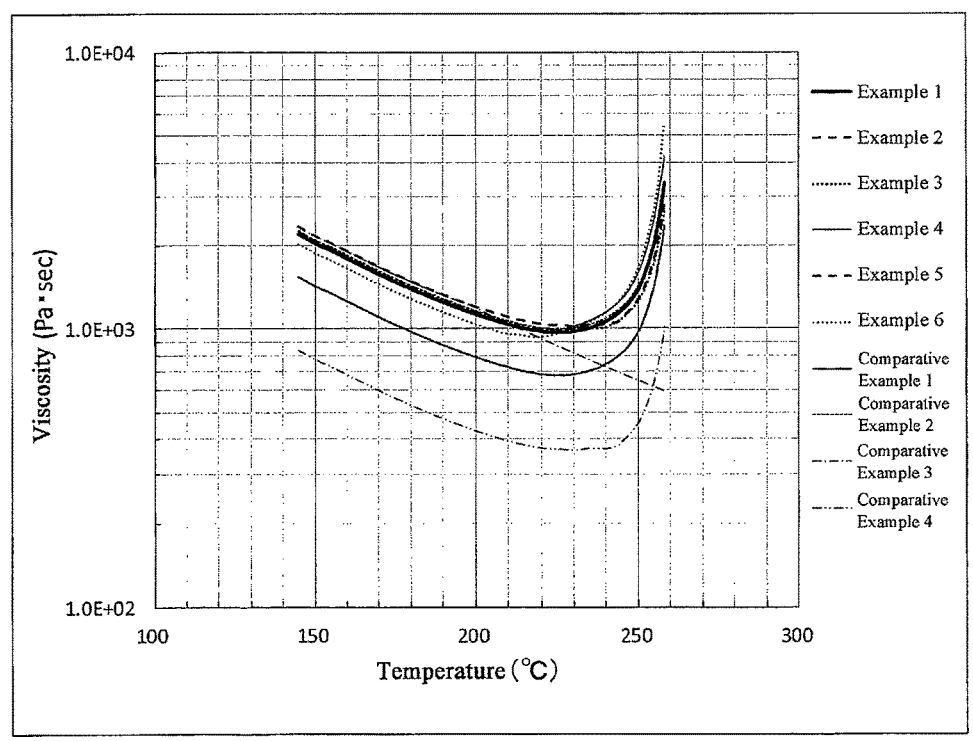
Figures 22, 23:
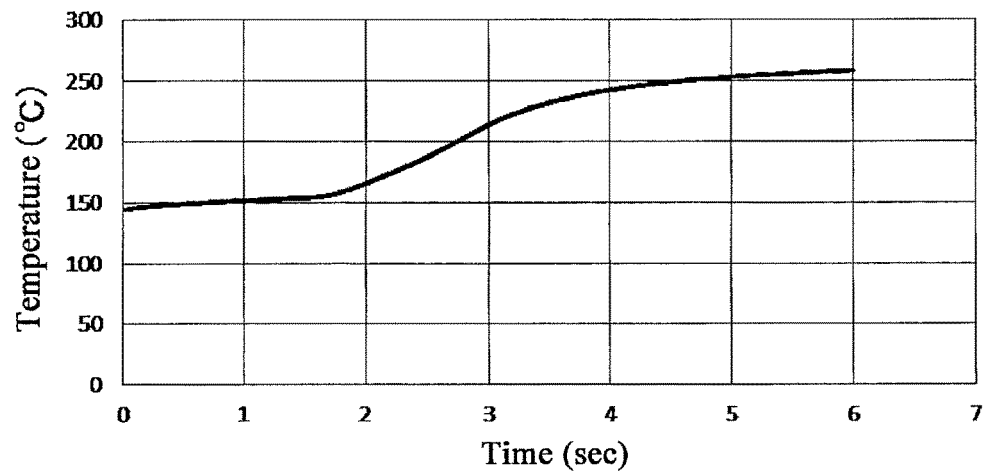

FIG. 19 is a drawing showing temperature changes of viscosity in the case of increasing the temperature of the thermosetting resin compositions of Examples 1 to 6 and Comparative Examples 1 to 4 according to the heating profile shown in FIG. 22.

Figure 20:
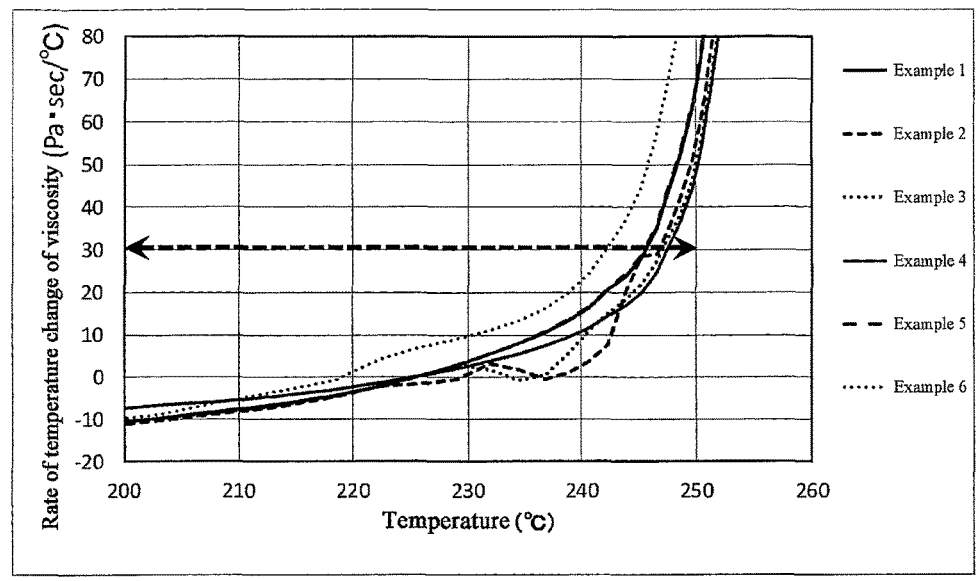

FIG. 20 is a schematic diagram showing the rate of temperature change of viscosity in the case of increasing the temperature of the thermosetting resin compositions of Examples 1 to 6 according to the heating profile shown in FIG. 22.

Figure 21:
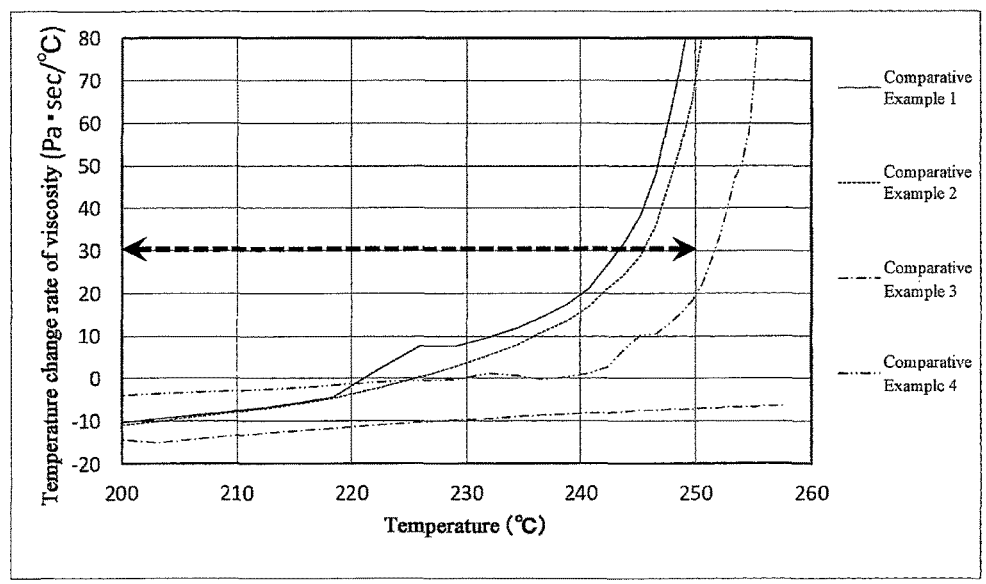

FIG. 21 is a schematic diagram showing the rate of temperature change of viscosity in the case of increasing the temperature of the thermosetting resin compositions of Comparative Examples 1 to 4 according to the heating profile shown in FIG. 22.

FIG. 22 shows the heating profile used for heating when fabricating the test pieces mounted with semiconductor chips of Examples 1 to 6 and Comparative Examples 1 to 4.

FIG. 23 indicates time and temperature values of the heating profile shown in FIG. 22.

Figure 24:
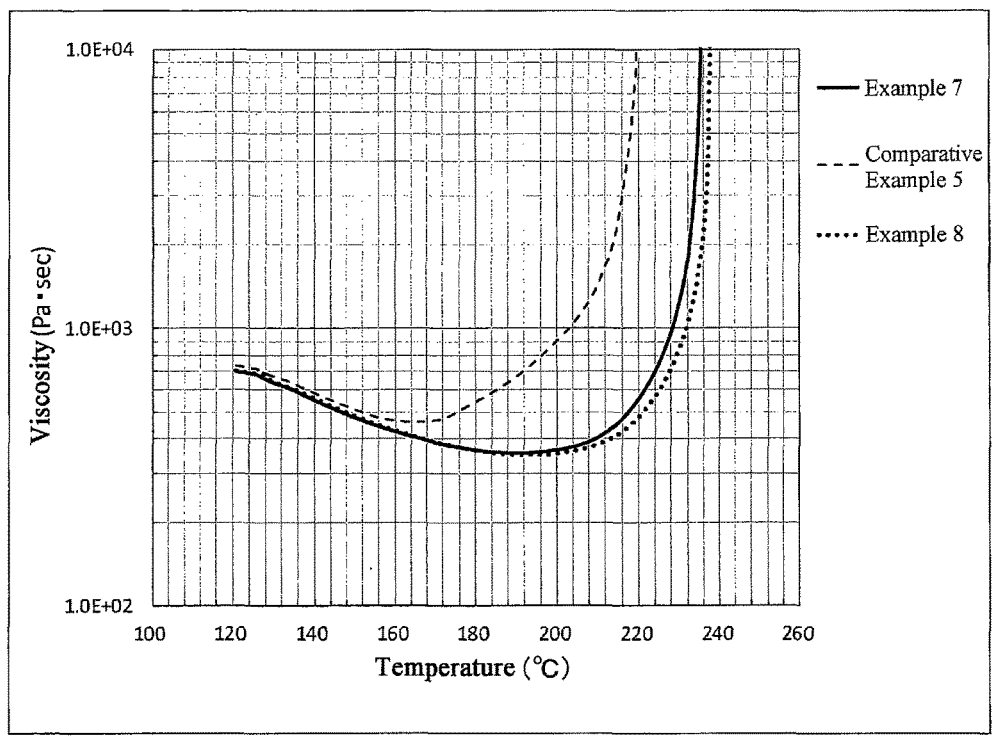

FIG. 24 is a drawing showing the rate of temperature change of viscosity in the case of increasing the temperature of the thermosetting resin compositions of Example 7, Example 8 and Comparative Example 5 according to a heating profile similar to that shown in FIG. 22.

Figure 25:
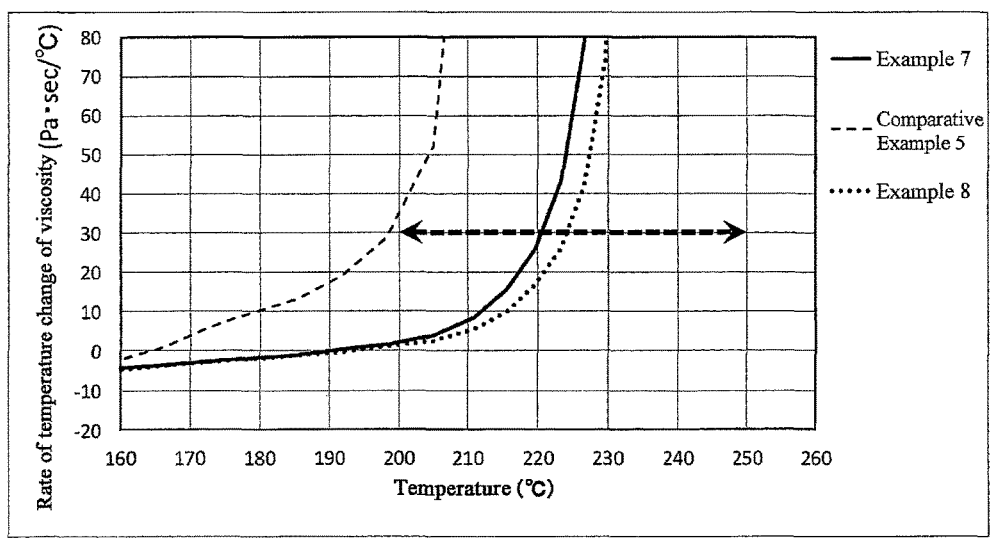

FIG. 25 is a drawing showing the rate of temperature change of viscosity in the case of increasing the temperature of the thermosetting resin compositions of Example 7, Example 8 and Comparative Example 5 according to a heating profile similar to that shown in FIG. 22.

DETAILED DESCRIPTION OF THE INVENTION

The present invention is a thermosetting resin composition containing a thermosetting resin, a curing agent and a fluxing agent. The thermosetting resin composition of the present invention demonstrates viscosity behavior such that the temperature at which the rate of temperature change of viscosity when temperature is increased according to a prescribed heating profile reaches 30 Pa·s/° C. is 200° C. to 250° C. The inventors of the present invention found that, in the case a thermosetting resin composition demonstrates viscosity behavior such that the temperature at which the rate of temperature change of viscosity when temperature is increased according to a prescribed heating profile reaches 30 Pa·s/° C. is 200° C. to 250° C., preferably 230° C. to 250° C. and more preferably 240° C. to 250° C., the thermosetting resin composition can be used as underfill for obtaining favorable solder connectivity while suppressing the formation of voids in the case of treating under heating conditions required by the underfill in a semiconductor chip thermocompression bonding step by a thermal compression bonding technique, thereby leading to completion of the present invention.

The following provides a more detailed explanation of the thermosetting resin composition of the present invention.

The thermosetting resin composition of the present invention demonstrates viscosity behavior such that the temperature at which the rate of temperature change of viscosity when temperature is increased according to a prescribed heating profile reaches 30 Pa·s/° C. is 200° C. to 250° C., preferably 230° C. to 250° C. and more preferably 240° C. to 250° C. A "prescribed heating profile" refers to a heating profile that complies with temperature behavior in a semiconductor chip mounting step (such as the heating profile shown in FIGS. 22 and 23). The prescribed heating profile is, for example, a heating profile that contains a rate of temperature increase of about 100° C./min to 5000° C./min when increasing temperature from 145° C. to 260° C. The prescribed heating profile can contain an average rate of temperature increase from 145° C. to 260° C. of about 500° C./min to 3000° C./min, and preferably about 800° C./min to 2000° C./min. In addition, the prescribed heating profile preferably contains an average rate of temperature increase from 152° C. to 253° C. of about 1000° C./min to 3000° C./min, and more preferably about 1300° C./min to 2000° C./min More specifically, the prescribed heating profile is a heating profile consisting of increasing temperature from 145° C. to 258° C. in 6 seconds. More specifically, the prescribed heating profile is preferably a heating profile in which, in addition to containing a rate of temperature increase of about 100° C./min to 5000° C./min, comprises increasing temperature from 145° C. to 152° C. in 1 second followed by increasing temperature from 152° C. to 253° C. in 4 seconds. A particularly preferable heating profile is the heating profile shown in FIGS. 22 and 23. The inventors of the present invention specifically demonstrated that, in the case the temperature at which the rate of temperature change of viscosity when temperature of a thermosetting resin composition is increased using the heating profile shown in FIGS. 22 and 23 reaches 30 Pa·s/° C. is 200° C. to 250° C., preferably 230° C. to 250° C. and more preferably 240° C. to 250° C., the thermosetting resin composition can be used as underfill for obtaining favorable solder connectivity while suppressing the formation of voids in a semiconductor chip thermocompression bonding step by a thermal compression bonding technique.

The rate of temperature change of viscosity when temperature of the thermosetting resin composition is increased according to a prescribed heating profile (to be simply referred to as the "prescribed viscosity temperature change rate") can be measured with an arbitrary method. However, under the present circumstances, there is currently no means for measuring viscosity behavior of a thermosetting resin composition that follows a rate of temperature increase that complies with temperature behavior in a semiconductor chip mounting step (such as the heating profile shown in FIGS. 22 and 23). Consequently, it is extremely difficult to directly measure the prescribed viscosity temperature change rate. Therefore, in order to obtain the thermosetting resin composition of the present invention, the prescribed viscosity temperature change rate can be obtained according to a method of predicting viscosity behavior explained below.

In the case of the thermosetting resin composition of the present invention, the rate of temperature change of viscosity when temperature is increased according to a prescribed heating profile can be obtained with the method of predicting viscosity behavior described below ("method of predicting viscosity behavior of the present embodiment").

The method of predicting viscosity behavior of the present embodiment comprises a reaction rate measurement step, a viscosity behavior measurement step, a reaction rate fitting step, a viscosity behavior fitting step, a virtual viscosity behavior calculation step and a viscosity temperature change rate calculation step. The following provides a detailed explanation of the method of predicting viscosity behavior of the present embodiment with reference to the drawings.

<Device Configuration>

Figure 1:
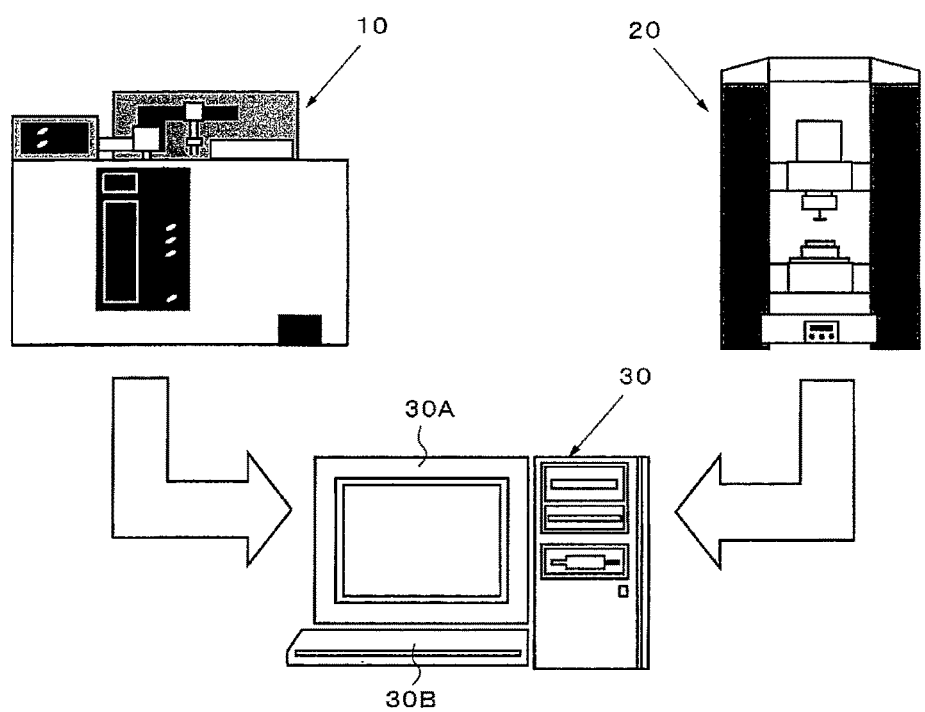
FIG. 1 is a schematic diagram showing a device able to be used in the present invention for carrying out a method of predicting viscosity behavior of a thermosetting resin composition according to one embodiment thereof.
Figure 2:
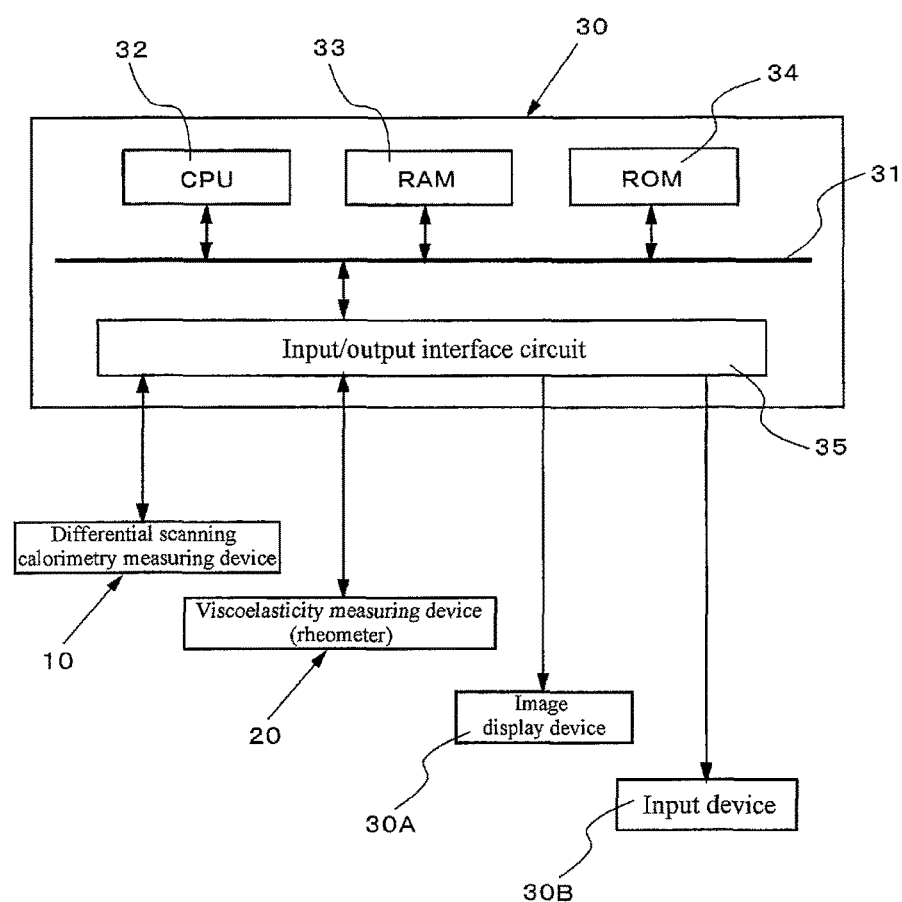
FIG. 2 is a block diagram showing the configuration of the aforementioned device.

First, an explanation is provided of a device for carrying out the method of predicting viscosity behavior of a thermosetting resin composition according to the present embodiment (method of predicting viscosity behavior of the present embodiment) with reference to FIGS. 1 and 2.

In the method of predicting viscosity behavior of a thermosetting resin composition according to the present embodiment, reaction rate and viscosity behavior of an evaluation sample in the form of the thermosetting resin composition for, for example, three rates of temperature increase, and by then analyzing the measurement results with dedicated simulation software according to the present embodiment, fitting curves are generated relating to viscosity behavior of the aforementioned thermosetting resin composition for each of the rates of temperature increase. Viscosity behavior of the aforementioned thermosetting resin composition for the prescribed heating profile is then predicted based on these fitting curves relating to viscosity behavior.

In FIG. 1, reference numeral 10 denotes a differential scanning calorimetry (DSC) measuring device for measuring reaction rate of the aforementioned thermosetting resin composition for three rates of temperature increase. The differential scanning calorimetry measuring device 10 measures temperature-dependent calorimetry peaks of the aforementioned thermosetting resin composition for the three rates of temperature increase. An example of a device that can be used for the differential scanning calorimetry measuring device 10 is the "DSC204F1 Phoenix®" manufactured by Netzsch GmbH.

In FIG. 1, reference numeral 20 denotes a rheometer (viscoelasticity measuring device) for measuring viscosity behavior of the aforementioned thermosetting resin composition for three rates of temperature increase. The rheometer 20 measures temperature-dependent viscosity behavior of the aforementioned thermosetting resin composition for three rates of temperature increase. An example of a device that can be used for the rheometer 20 is the "Haake Mars III®" manufactured by Thermo Scientific Inc.

Measurement data of the differential scanning calorimetry measuring device 10 and the rheometer 20 are respectively input into a computer 30 and analyzed with the simulation software of the present embodiment installed in the computer 30. As shown in FIG. 2, the computer 30 is provided with a central processing unit (CPU) 32, random access memory (RAM) 33, read only memory (ROM) 34 and input/output interface circuit 35 connected to an input/output bus 31.

In addition to an image display device 30A, such as a liquid crystal display, and an input device 30B, such as a keyboard or mouse, the aforementioned differential scanning calorimetry measuring device 10 and the rheometer 20 are connected to the input/output interface circuit 35 of the computer 30. In addition, the simulation software of the present embodiment is erasably stored in the RAM 33, and this simulation software is executed by the CPU 32.

A user sets measurement conditions of the differential scanning calorimetry measuring device 10 and the rheometer 20 through the computer 30, and has the differential scanning calorimetry measuring device 10 and the rheometer 20 perform actual measurement of reaction rate and viscosity behavior of the aforementioned thermosetting resin composition. Measurement results of the differential scanning calorimetry measuring device 10 and the rheometer 20 are input to the computer 30 via the input/output interface circuit 35. Results of analytical processing by the computer 30 obtained in accordance with the simulation software based on the input measurement results are output to the image display device 30A.

Furthermore, although the present embodiment is configured such that the simulation software is downloaded ex post facto into the RAM 33 of the general-purpose computer 30, the present embodiment is not limited to this configuration, but rather the simulation software of the present embodiment may also be stored in the ROM 34 and the computer 30 may be used as a dedicated unit for carrying out the method of predicting viscosity behavior of the present embodiment.

<Simulation Software>

Figure 3:
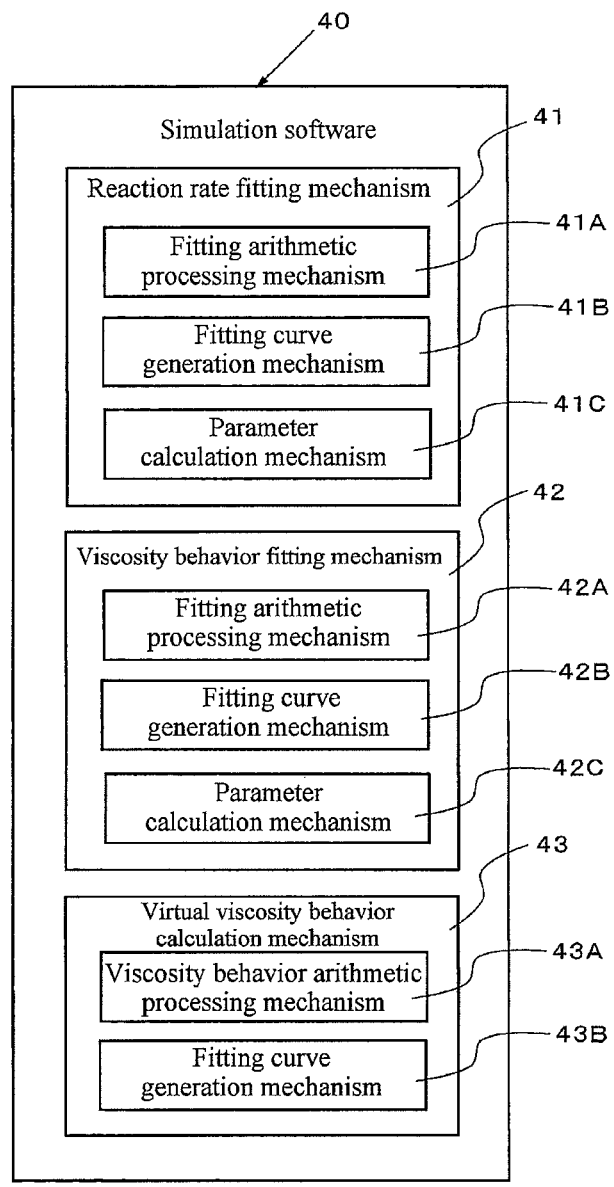
FIG. 3 is a functional flow chart showing the configuration of simulation software for carrying out the aforementioned method of predicting viscosity behavior of a thermosetting resin composition.

Next, an explanation is provided of the configuration of the simulation software of the present embodiment stored in the RAM 33 of the computer 30 with reference to FIG. 3.

In FIG. 3, the simulation software 40 of the present embodiment is configured to mainly include a reaction rate fitting mechanism 41, a viscosity behavior fitting mechanism 42, and a virtual viscosity behavior calculation mechanism 43.

<<Reaction Rate Fitting Mechanism>>

The reaction rate fitting mechanism 41 is configured to include a fitting arithmetic processing mechanism 41A, a fitting curve generation mechanism 41B, and a parameter calculation mechanism 41C. The fitting arithmetic processing mechanism 41A carries out arithmetic processing that fits measurement data of each rate of temperature increase from the differential scanning calorimetry measuring device 10 shown in FIG. 1 to a Kamal model formula. The fitting curve generation mechanism 41B generates a fitting curve of calorimetry and time of the aforementioned thermosetting resin composition and a fitting curve of the calorimetry and temperatures of the thermosetting resin composition for each rate of temperature increase based on a result of the arithmetic processing of the fitting arithmetic processing mechanism 41A. The parameter calculation mechanism 41C calculates parameters of the Kamal model formula determined by the materials of the aforementioned thermosetting resin composition.

<<Viscosity Behavior Fitting Mechanism>>

The viscosity behavior fitting mechanism 42 is configured to include a fitting arithmetic processing mechanism 42A, a fitting curve generation mechanism 42B, and a parameter calculation mechanism 42C. The fitting arithmetic processing mechanism 42A carries out arithmetic processing that fits the parameters of the Kamal model formula calculated by the reaction rate fitting mechanism 41 and the measurement data for each rate of temperature increase from the rheometer 20 shown in FIG. 1 to a Castro-Macosko model formula. The fitting curve generation mechanism 42B generates a fitting curve of viscosity and time of the aforementioned thermosetting resin composition and a fitting curve of the viscosity and temperatures of the aforementioned thermosetting resin composition for each rate of temperature increase based on a result of the arithmetic processing of the fitting arithmetic processing mechanism 42A. The parameter calculation mechanism 42C calculates parameters of the Castro-Macosko model formula determined by the materials of the aforementioned thermosetting resin composition.

<<Virtual Viscosity Behavior Calculation Mechanism>>

The virtual viscosity behavior calculation mechanism 43 is configured to include a viscosity behavior arithmetic processing mechanism 43A and a fitting curve generation mechanism 43B. The viscosity behavior arithmetic processing mechanism 43A calculates virtual viscosity behavior of the aforementioned thermosetting resin composition for an arbitrary rate of temperature increase other than the three rates of temperature increase based on the fitting curve of viscosity and time and the fitting curve of the viscosity and temperatures of the aforementioned thermosetting resin composition generated by the viscosity behavior fitting mechanism 42 by simulation. The fitting curve generation mechanism 43B generates a fitting curve indicating the virtual viscosity behavior of the aforementioned thermosetting resin composition for an arbitrary rate of temperature increase based on the calculation result of the viscosity behavior arithmetic processing mechanism 43A.

<<Others>>

Furthermore, dedicated measurement and analysis software is normally available for the differential scanning calorimetry measuring device 10 and the rheometer 20. The simulation software 40 of the present embodiment may also include a program that analyzes measurement data of the differential scanning calorimetry measuring device 10 and the rheometer 20 to allow the computer 30 to generate measurement results as shown in FIGS. 6(a) and 7.

<Method of Predicting Viscosity Behavior of Thermosetting Resin Composition>

Next, a detailed description is provided of the method of predicting viscosity behavior of a thermosetting resin composition of the present embodiment using the differential scanning calorimetry measuring device 10, the rheometer 20, and the computer 30 with reference to FIGS. 4 to 14.

<<Technical Significance of Present Measurement Method>>

Since a thermal compression bonding technique is typically carried out at a rapid rate of temperature increase of 1800° C./min to 3000° C./min, there is the problem of the formation of voids attributable to viscosity behavior of the underfill (thermosetting resin composition) used. In addition, there is also the problem of the occurrence of defective solder connections. Namely, although the formation of voids can be suppressed if the viscosity of the underfill used is high relative to a rapid rate of temperature increase of 1800° C./min to 3000° C./min, this results in increased susceptibility to the occurrence of defective solder connections. Conversely, if the viscosity of the underfill used becomes low relative to a rapid rate of temperature increase of 1800° C./min to 3000° C./min, although defective solder connections no longer occur, there is increased susceptibility to the formation of voids.

Consequently, control of viscosity during rapid rates of temperature increase is required for the development of underfill used in the thermal compression bonding technique. However, the rate of temperature increase used in the thermal compression bonding technique is excessively high at 500° C./min to 3000° C./min. Since an ordinary conventional viscosity measuring device in the form of a rheometer is limited to measuring at up to 10° C./min, it is not at all possible to actually measure viscosity at a rate of temperature increase of 500° C./min to 3000° C./min. Moreover, since underfill exhibits an increase in viscosity due to the start of gelation when the temperature increases, it is extremely difficult to predict viscosity during a rapid rate of temperature increase of 500° C./min to 3000° C./min from the behavior during a slow rate of temperature increase of 10° C./min.

Therefore, in the method of predicting viscosity behavior of a thermosetting resin composition of the present embodiment, viscosity is predicted by taking into consideration curing of the underfill during a rapid rate of temperature increase. In order to determine the dependency of the underfill on the degree of curing, the result of measurement for each of the three rates of temperature increase obtained with the differential scanning calorimetry measuring device 10 is fit to the Kamal model formula. Next, in order to obtain dependency of the underfill on the rate of temperature increase, the result of measurement for each of the three rates of temperature increase obtained with the rheometer 20 is fit to the Castro-Macosko model formula. Subsequently, the degree of curing and the rate of temperature increase of the underfill are combined to enable prediction of the viscosity behavior by integrating and taking the behavior thereof into consideration.

<<Reaction Rate Measurement Step>>

Each of the calorimetry peaks of a thermosetting resin composition is respectively measured for three or more rates of temperature increase in the reaction rate measurement step of the method of predicting viscosity behavior of the present embodiment.

Figure 4:
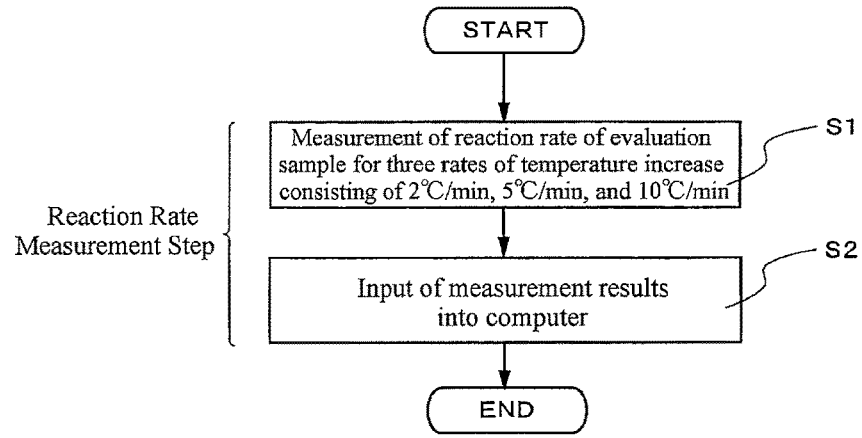
FIG. 4 is a flow chart showing the procedure of a reaction rate behavior measurement step in the aforementioned method of predicting viscosity behavior of a thermosetting resin composition.

FIG. 4 is a flow chart showing the procedure of a reaction rate measurement step of an evaluation sample in the form of a thermosetting resin composition. In this reaction rate measurement step, reaction rates of the aforementioned thermosetting resin composition are respectively measured for three or more rates of temperature increase. In the present embodiment, calorimetry peaks of the aforementioned thermosetting resin composition are respectively measured with the differential scanning calorimetry measuring device 10 shown in FIG. 1 for three rates of temperature increase of 2° C./min, 5° C./min, and 10° C./min using a pre-applied underfill material in the form of "XS8448-196" manufactured by NAMICS Corporation, which is the present applicant, for the aforementioned thermosetting resin composition (Step S1 in FIG. 4). In this manner, in this reaction rate measurement step, the three or more rates of temperature increase preferably comprise at least 2° C./min, 5° C./min and 10° C./min. In addition, in the reaction rate measurement step, calorimetry peaks of the thermosetting resin composition are preferably measured with a differential scanning calorimetry measuring device.

Respective measurement data for the three rates of temperature increase obtained with the differential scanning calorimetry measuring device 10 is respectively input into the computer 30 (Step S2 in FIG. 4). The computer 30 corrects the 0 (zero) value of the respective measurement data in accordance with dedicated software of the differential scanning calorimetry measuring device 10 or the simulation software of the present embodiment to generate a graph representing the relationship between calorimetry and temperature (temperature dependent reaction rate) as shown in FIG. 6(a). According to the measurement result of FIG. 6(a), it can be understood that, in the case of any of the rates of temperature increase of 2° C./min, 5° C./min and 10° C./min, although a small initial peak is exhibited, general reaction rate curves are plotted in which the peak temperature becomes higher as the rate of temperature increase becomes higher.

Here, the reason for measuring the respective reaction rates of the aforementioned thermosetting resin composition for three or more rates of temperature increase is to identify the relationship between a variable amount and a change in viscosity when both have been varied in order to obtain a single formula that takes into consideration dependency of the viscosity on temperature and on the rate of temperature increase of the aforementioned thermosetting resin composition. Although the accuracy of identification can be expected to increase as the amount of measurement data increases by using different rates of temperature increase such as four, five or six rates, in actuality, an expected identification formula is obtained if the measurement data is for three rates of temperature increase.

In addition, the reason for measuring calorimetry peaks of the aforementioned thermosetting resin composition is as indicated below. Namely, viscosity of the aforementioned thermosetting resin composition increases due to the occurrence of a curing phenomenon in which a reactive group of the resin opens and initiates a reaction with a curing agent when provided with temperature and time calorimetry peaks of the aforementioned thermosetting resin composition suggest the temperature and time at which curing phenomenon proceeds to the greatest degree. Thus, changes in viscosity attributable to curing can be determined by identifying the relationship among temperature, time and viscosity based on calorimetry peaks of the aforementioned thermosetting resin composition.

<<Viscosity Behavior Measurement Step>>

In the viscosity behavior measurement step of the method of predicting viscosity behavior of the present embodiment, viscosity behavior of a thermosetting resin composition is respectively measured for three or more rates of temperature increase.

In the viscosity behavior measurement step of the method of predicting viscosity behavior of the present embodiment, viscosity behavior of a thermosetting resin composition is respectively measured for three or more rates of temperature increase. In the case of the thermosetting resin composition of the present invention, the viscosity behavior measurement step preferably includes measurement of viscosity behavior of a thermosetting resin composition with a viscoelasticity measuring device.

Figure 5:
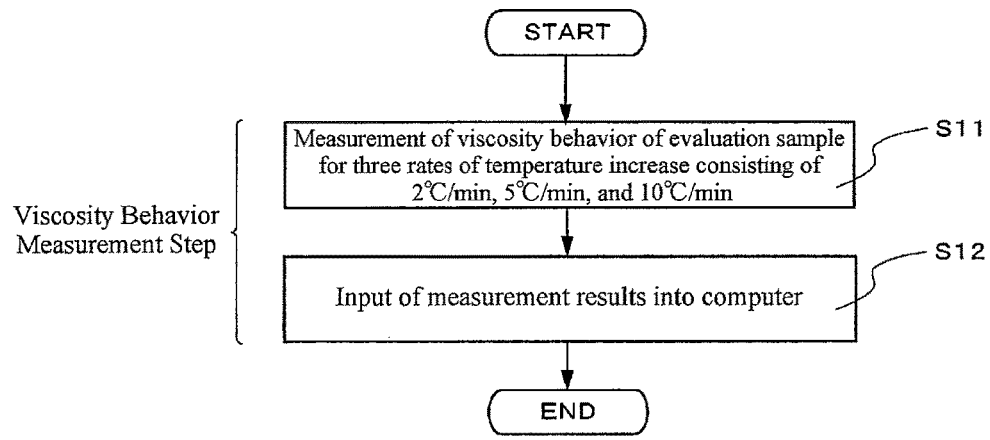
FIG. 5 is a flow chart showing the procedure of a viscosity behavior measurement step in the aforementioned method of predicting viscosity behavior of a thermosetting resin composition.

FIG. 5 is a flow chart showing the procedure of the viscosity behavior measurement step of the aforementioned thermosetting resin composition. In this viscosity behavior measurement step, viscosity behavior of the aforementioned thermosetting resin composition is respectively measured for three rates of temperature increase of 2° C./min, 5° C./min and 10° C./min with the rheometer 20 shown in FIG. 1 (Step S11 in FIG. 5). Measurement is carried out with the aforementioned thermosetting resin composition in the state of a resin paste and conditions of the rheometer 20 consisting of distortion of 0.5% and 1 Hz using a parallel cone of 40 mm diameter with a gap of 500 μm.

Respective measurement data of the three types of viscosity behavior obtained with the rheometer 20 is respectively input into the computer 30 (Step S11 in FIG. 5). The computer 30 generates a graph representing the relationship between viscosity and temperature (temperature-dependent viscosity) as shown in FIG. 7 in accordance with dedicated software of the rheometer 20 or a program of the simulation software of the present embodiment.

<<Reaction Rate Fitting Step>>

In the reaction rate fitting step of the method of predicting viscosity behavior of the present embodiment, measurement data for each rate of temperature increase obtained in the reaction rate measurement step is fit to the Kamal model formula, a fitting curve of calorimetry and time and a fitting curve of calorimetry and temperature are obtained for a thermosetting resin composition, and parameters of the Kamal model formula determined by the materials of the thermosetting resin composition are calculated. The reaction rate fitting mechanism 41 is used in the reaction rate fitting step.

Figure 8:
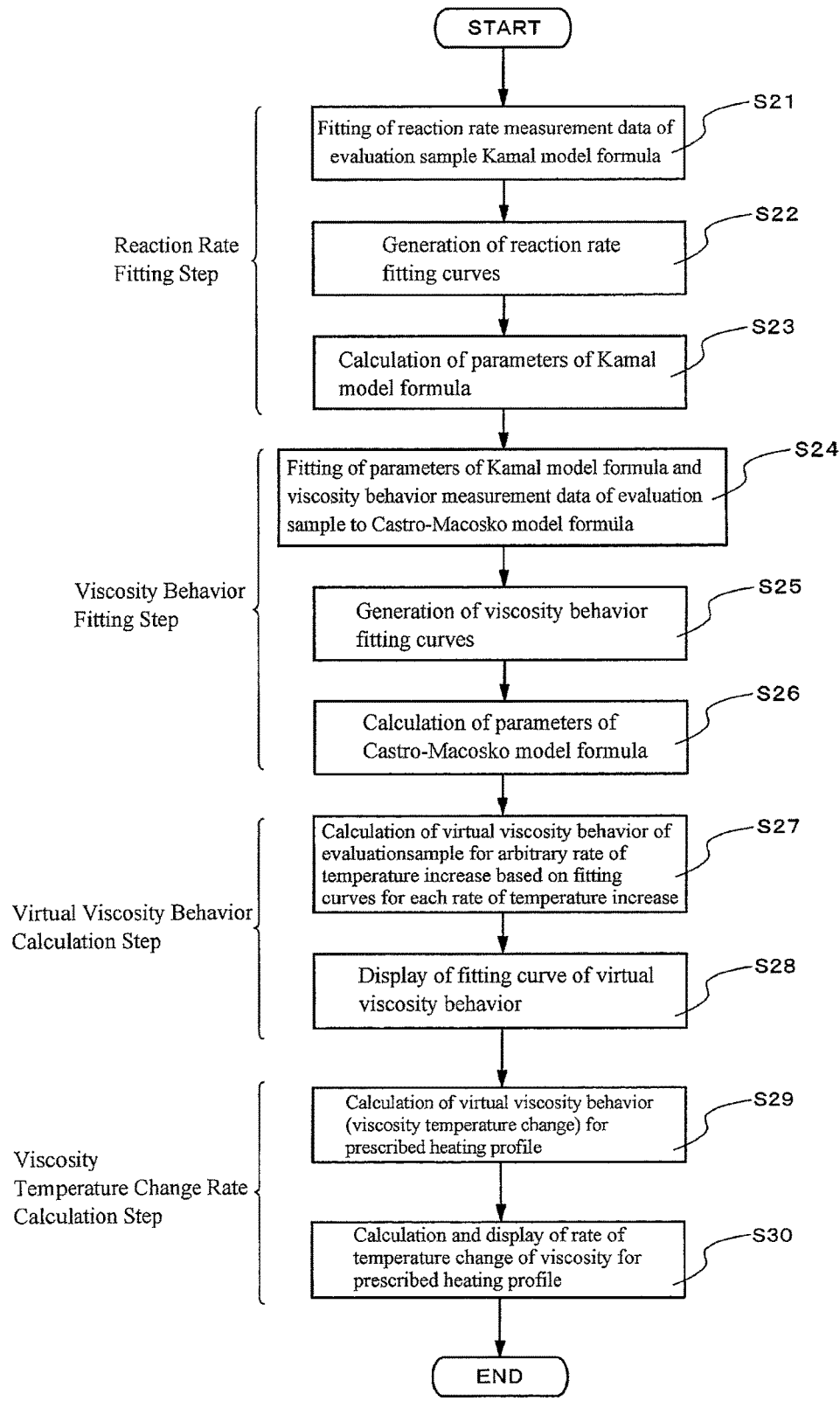
FIG. 8 is a flow chart showing the procedures of a reaction rate fitting step, a viscosity behavior fitting step and a virtual viscosity behavior calculation step in the aforementioned method of predicting viscosity behavior of a thermosetting resin composition.

FIG. 8 is a flow chart showing the procedures of the reaction rate fitting step, viscosity behavior fitting step and virtual viscosity behavior calculation step of the method of predicting viscosity behavior of the aforementioned thermosetting resin composition. Each of these steps is processed by the computer 30 based on measurement data of the aforementioned reaction rate measurement step and viscosity behavior measurement step in accordance with a program of the simulation software of the present embodiment.

The procedure of the reaction rate fitting step is shown in Steps S21 to S23 of FIG. 8. Preprocessing of Steps S21 to S23 consists of the computer 30 correcting measurement data obtained in the reaction rate measurement step of FIG. 4 for the zero line, and adjusting the data so that there is as little difference as possible in the total calorific value for each rate of temperature increase. If a difference in the total calorific value for each rate of temperature increase should happen to occur, an uncured portion ends up being present in the aforementioned thermosetting resin composition and accuracy is predicted to decrease.

Next, processing proceeds to Step S21 and the computer 30 fits the measurement data for each rate of temperature increase obtained in the reaction rate measurement step of FIG. 4 to a Kamal model formula of the following Equation (1). The Kamal model formula is a formula for modeling the relationship between calorimetry and temperature (or time) in the form of a reaction rate curve of a thermosetting resin composition measured under conditions of a constant rate of temperature increase and constant weight (in terms of per unit weight).

$$\frac{\Delta\alpha(T)}{\Delta t} = \left(A_1 \exp\left(-\frac{E_1}{T+273.15}\right) + A_2 \exp\left(-\frac{E_2}{T+273.15}\right)\alpha(t)^m\right)(1-\alpha(t))^n \quad (1)$$

In the above equation, $A_1$, $E_1$, $A_2$, $E_2$, m, and n are parameters determined according to the materials of the thermosetting resin composition. It is necessary to respectively determine each of these parameters for each thermosetting resin composition in the case of thermosetting resin compositions having different types of materials and/or different incorporated amounts of materials.

Here, although the inventors of the present invention initially fit measurement data of the reaction rate measurement step using the aforementioned Equation (1), the measurement data ended up diverging without being able to be contained within a range of convergence error. The cause of this is thought to be the presence of differences in the total calorific value for each rate of temperature increase. The total calorific value for each rate of temperature increase is shown in FIG. 6(b). As shown in FIG. 6(b), the total calorific value for each rate of temperature increase can be seen to have variation of about 8% to 5%.

Therefore, in the present embodiment, fitting was attempted with a modified Kamal model formula of Equation (2), obtained by doubly superimposing the aforementioned Kamal model formula of Equation (1), in order to accommodate cases of variation in total calorific value for each rate of temperature increase and cases of excessive noise due to the presence of multiple calorimetry peaks.

$$\frac{d\alpha(t)}{dt} = \left(A_1 \exp\left(-\frac{E_1}{T(t)}\right) + A_2 \exp\left(-\frac{E_2}{T(t)}\right)\alpha(t)^m\right)(1-\alpha(t))^n \times \quad (2)$$

-continued $$\frac{1}{1+\exp[T(t)-T_b]} + \left(B_1\exp\left(-\frac{F_1}{T(t)}\right) + B_2\exp\left(-\frac{F_2}{T(t)}\right)\alpha(t)^p\right)$$

$$(1-\alpha(t))^q \times \frac{1}{1+\exp[-(T(t)-T_b)]}$$

In the above equation, $A_1$, $E_1$, $A_2$, $E_2$, m, n, $B_1$, $F_1$, $B_2$, $F_2$, p, q, and $T_b$ are parameters determined for the materials of the thermosetting resin composition. It is necessary to respectively determine each of these parameters for each thermosetting resin composition in the case of thermosetting resin compositions having different types of materials and/or different incorporated amounts of materials.

Although the aforementioned Kamal model formula of Equation (1) is fit using six parameters, the aforementioned modified Kamal model formula of Equation (2) of the present embodiment is fit using twice that number of twelve parameters. As a result, it becomes possible to fit a complex model more flexibly.

Consequently, in the case of the thermosetting resin composition of the present invention, the Kamal model formula used in the reaction rate fitting step is preferably the aforementioned modified Kamal model formula of Equation (2) obtained by doubly superimposing the Kamal model formula of Equation (1).

Figure 9A:
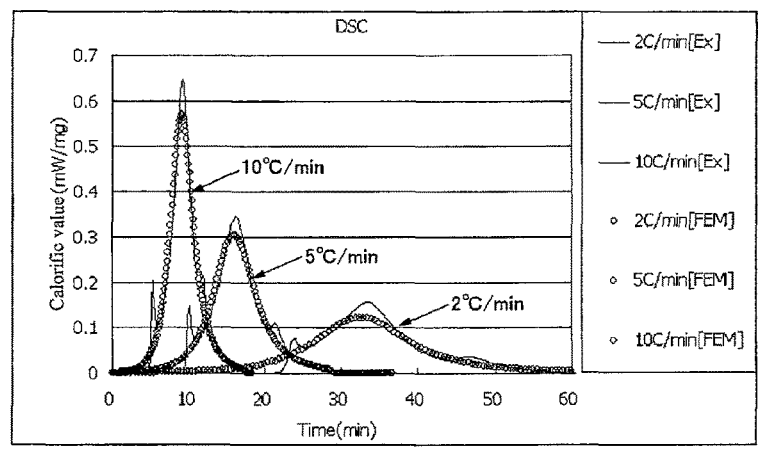
FIG. 9(a) is a graph showing actual calorimetry and time measurement data of the aforementioned thermosetting resin composition obtained in the aforementioned reaction rate measurement step and fitting curves obtained in the aforementioned reaction rate fitting step.
Figure 9B:
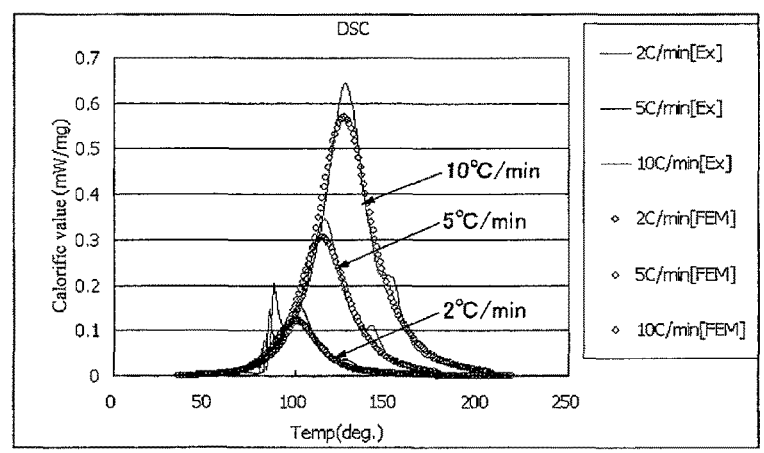
FIG. 9(b) is a graph showing actual calorimetry and time measurement data of the aforementioned thermosetting resin composition obtained in the aforementioned reaction rate measurement step and fitting curves obtained in the aforementioned reaction rate fitting step.

Next, processing proceeds to Step S22 of FIG. 8 and the computer 30 generates a fitting curve of the reaction rate for each rate of temperature increase. Fitting curves of reaction rates for each rate of temperature increase generated with the aforementioned modified Kamal model formula of Equation (2) are shown in FIGS. 9(a) and 9(b). FIG. 9(a) is a graph showing actual calorimetry and time measurement data (time-dependent reaction rate) of the aforementioned thermosetting resin composition obtained in Step S1 of FIG. 4 along with fitting curves obtained Step S22 of FIG. 8. FIG. 9(b) is a graph showing actual calorimetry and time measurement data (temperature-dependent reaction rate) of the aforementioned thermosetting resin composition obtained in Step S1 of FIG. 4 along with fitting curves obtained in Step S22 of FIG. 8.

As shown in FIGS. 9(a) and 9(b), when comparing reaction rate measured data with the fitting curves, although there are some differences between calorific values in the vicinity of the peaks, the rise and fall closely agree. Thus, there are no problems with the fitting curves.

Next, processing proceeds to Step S23 of FIG. 8 and the computer 30 calculates parameters $A_1$, $E_1$, $A_2$, $E_2$, m, n, $B_1$, $F_1$, $B_2$, $F_2$, p, q, and $T_b$ in the aforementioned modified Kamal model formula of Equation (2) determined according to the material of the aforementioned thermosetting resin composition based on the fitting results of Steps S21 and S22. FIG. 10 shows a list of these parameters.

<<Viscosity Behavior Fitting Step>>

In the viscosity behavior fitting step of the method of predicting viscosity behavior of the present embodiment, the parameters of the Kamal model formula calculated in the reaction rate fitting step and the measurement data for each rate of temperature increase obtained in the viscosity behavior measurement step are fit to a Castro-Macosko model formula. Moreover, a fitting curve of viscosity and time and a fitting curve of viscosity and temperature of a thermosetting resin composition for each rate of temperature increase are obtained, and parameters of the Castro-Macosko model formula determined according to the materials of the thermosetting resin composition are calculated. The viscosity behavior fitting mechanism 42 is used in the viscosity behavior fitting step.

The procedure of the viscosity behavior fitting step is shown in Steps S24 to S26 of FIG. 8. First, in Step S24, the computer 30 fits the parameters of the modified Kamal model formula of Equation (2) calculated in Step S23 and the measurement data for each rate of temperature increase obtained in the viscosity behavior measurement step (Steps S11 and S12) of FIG. 5 to the Castro-Macosko model formula of the following Equation (4). Here, the Castro-Macosko model formula of the following Equation (4) is an equation of applying the Castro model formula to the thermoplastic component of a Macosko model formula of the following Equation (3). The Macosko model formula of the following Equation (3) is a formula for modeling a viscosity growth curve representing the relationship between viscosity and time of a thermosetting resin composition measured under conditions of a constant rate of temperature increase.

$$\eta(t) = \underbrace{\eta_{tp}(T,\dot{\gamma})}_{\text{Thermoplastic Component}} \underbrace{\left(\frac{\alpha_{gel}}{\alpha_{gel}-\alpha(t)}\right)^{E+F\alpha(t)}}_{\text{Thermosetting Component}} \quad (3)$$

$$\eta(t) = \frac{\eta_0(T)}{1+\left(\frac{\eta_0(T)\omega}{\tau^*}\right)^{1-r}}\left(\frac{\alpha_{gel}}{\alpha_{gel}-\alpha(t)}\right)^{E+F\alpha(t)} \quad \eta_0(T) = B\exp\left(\frac{T_B}{T}\right). \quad (4)$$

In the above equations, B, $T_B$, $\tau^*$, r, $\omega$, $\alpha_{gel}$, E, and F are parameters determined by the materials of the thermosetting resin composition.

Next, processing proceeds to Step S25 of FIG. 8 and the computer 30 generates a fitting curve of viscosity behavior for each rate of temperature increase. FIGS. 11(a) and 11(b) show fitting curves of viscosity behavior for each rate of temperature increase generated by the aforementioned Castro-Macosko model formula of Equation (4). FIG. 11(a) is a graph showing actual measurement data of calorimetry and time (time-dependent viscosity behavior) of the aforementioned thermosetting resin composition obtained in Step S11 of FIG. 5 and fitting curves obtained in Step S25 of FIG. 8. FIG. 11(b) is a graph showing actual measurement data of calorimetry and temperature (temperature-dependent viscosity behavior) of the aforementioned thermosetting resin composition obtained in Step S11 of FIG. 5 and fitting curves obtained in Step S25 of FIG. 8. As shown in FIGS. 11(a) and 11(b), when comparing the actual measurement data of viscosity behavior with the fitting curves, they can be seen to closely agree. Thus, there are no problems with the fitting curves.

Next, processing proceeds to Step S26 of FIG. 8 and the computer 30 calculates the parameters B, $T_B$, $\tau^*$, r, $\omega$, $\alpha_{gel}$, E and F of the aforementioned Castro-Macosko model formula of Equation (4) determined according to the materials of the aforementioned thermosetting resin composition based on the fitting results of Steps S24 and S25. FIG. 12 indicates a list of these parameters.

<<Virtual Viscosity Behavior Calculation Step>>

In the virtual viscosity behavior calculation step of the method of predicting viscosity behavior of the present embodiment, virtual viscosity behavior of a thermosetting resin composition for a prescribed heating profile is calculated by simulation based on each of the fitting curves for each rate of temperature increase obtained in the viscosity behavior fitting step. The virtual viscosity behavior calculation mechanism 43 described below is used in the virtual viscosity behavior calculation step.

The procedure of the virtual viscosity behavior calculation step is shown in Steps S27 and S28 of FIG. 8. In Step S27, the computer 30 calculates the virtual viscosity behavior of the aforementioned thermosetting resin composition for an arbitrary rate of temperature increase by simulation based on each of the fitting curves of each rate of temperature increase obtained in Steps S24 to S26. Subsequently, processing proceeds to Step S28 and the computer 30 generates a fitting curve representing the virtual viscosity behavior of the aforementioned thermosetting resin composition at an arbitrary rate of temperature increase based on the calculation results of Step S27. A prescribed heating profile can be obtained by combining the fitting curves representing the virtual viscosity behavior of the aforementioned thermosetting resin composition for an arbitrary rate of temperature increase.

Figure 13:
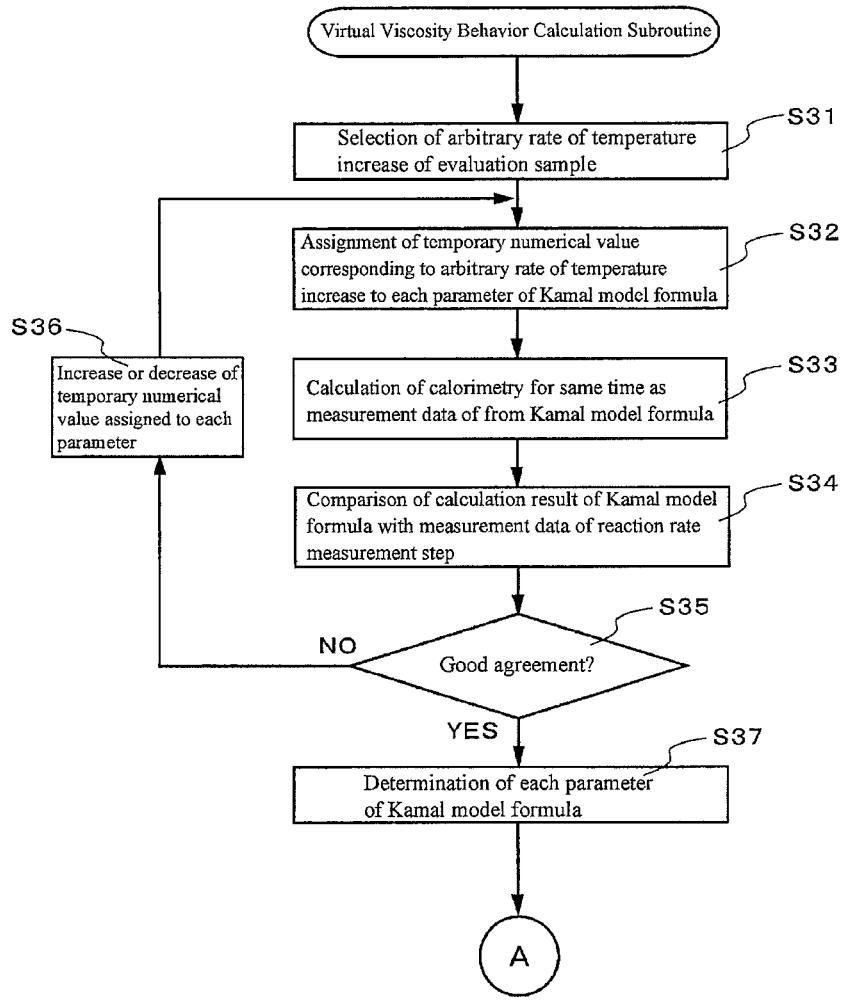
FIG. 13 is a flow chart of the first half (reaction rate component) of a virtual viscosity behavior calculation subroutine showing specific treatment in the aforementioned virtual viscosity behavior calculation step.
Figure 14:
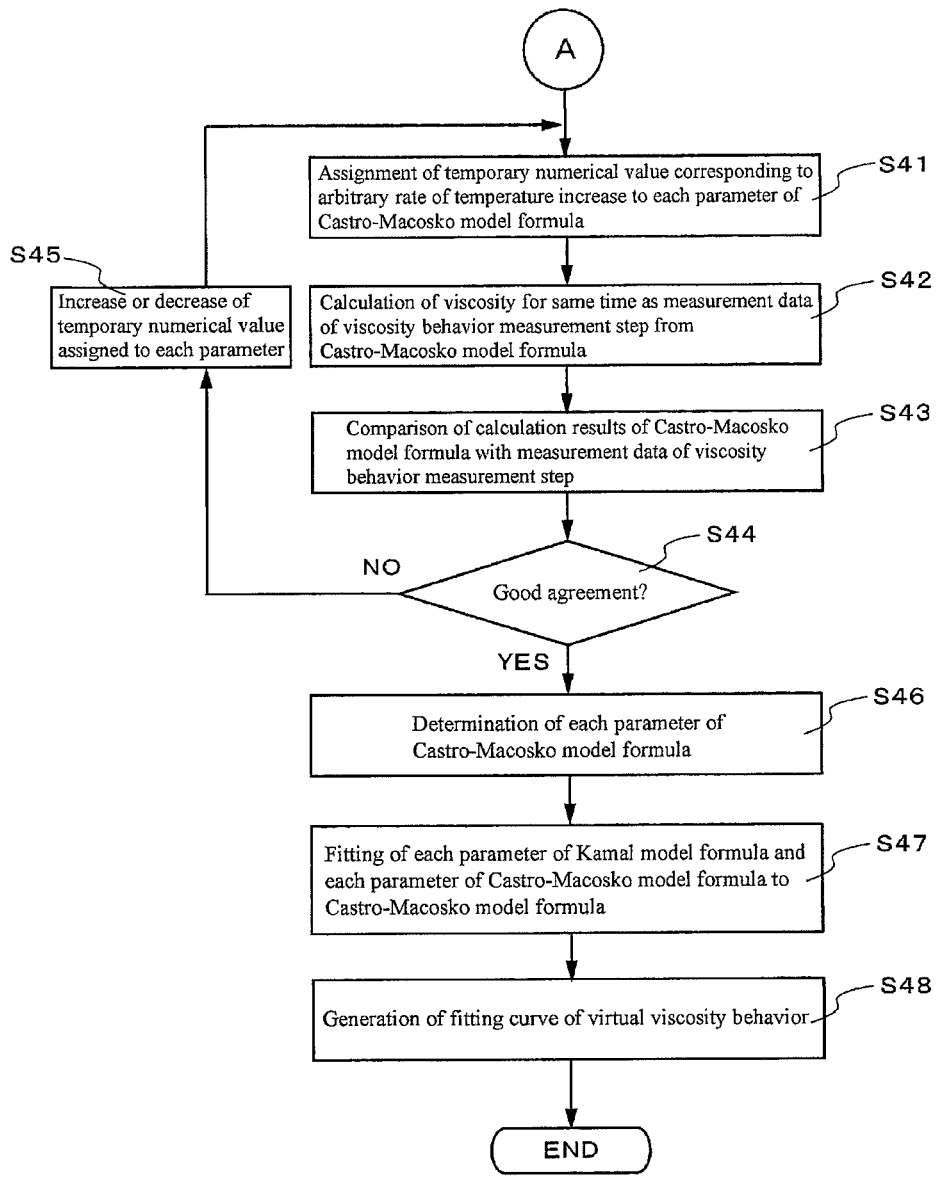
FIG. 14 is a flow chart of the second half (viscosity behavior component) of a virtual viscosity behavior calculation subroutine showing specific treatment in the aforementioned virtual viscosity behavior calculation step.

Here, an explanation of simulation processing carried out in the virtual viscosity behavior calculation step 27 is provided with reference to the virtual viscosity behavior calculation subroutine shown in FIGS. 13 and 14. FIG. 13 indicates processing in the former rate reaction component while FIG. 14 shows processing in the latter viscosity behavior component of the subroutine.

First, in Step S31 of FIG. 13, the computer 30 selects an arbitrary rate of temperature increase of an evaluation sample in accordance with an input by a user. The "arbitrary rate of temperature increase" referred to here may be a rapid rate of temperature increase of 500° C./min to 3000° C./min, for example, that is unable to be measured with the rheometer 20.

Next, processing proceeds to Step S32 and the computer 30 assigns a temporary numerical value corresponding to the arbitrary rate of temperature increase to each parameter of the Kamal model formula (the aforementioned modified Kamal model formula in the present embodiment). After then proceeding to Step S33, the computer 30 calculates calorimetry for the same time as the reaction rate measurement step (Step S1) of FIG. 4 from the Kamal model formula.

Subsequently, in Step S34, the computer 30 compares the calculation result of calorimetry obtained from the Kamal model formula with calorimetry measurement data obtained in the reaction rate measurement step (Step S1) of FIG. 4, and determines whether or not agreement between these values is good (whether or not agreement is within an acceptable range). In the case agreement is not judged to be good (NO), processing proceeds to Step S36 and the computer 30 repeats the processing of Steps S32 to S35 by increasing or decreasing the temporary numerical value assigned to each parameter of the Kamal model formula. On the other hand, in the case agreement is judged to be good (YES), processing proceeds to Step S37 and the computer 30 determines each parameter of the Kamal model formula.

Next, processing proceeds to Step S41 of FIG. 14 and the computer 30 assigns a temporary numerical value corresponding to the arbitrary rate of temperature increase to each parameter of the Castro-Macosko model formula. Processing then proceeds to Step S42 and the computer 30 calculates viscosity for the same time as that of the viscosity behavior measurement step (Step S11) of FIG. 5 from the Castro-Macosko model formula.

Subsequently, in Step S43, the computer 30 compares the calorimetry calculation result obtained from the Castro-Macosko model formula with viscosity measurement data obtained in the viscosity behavior measurement step (Step S11) of FIG. 5 and determines whether or not agreement between these values is good (whether or not agreement is within an acceptable range). In the case agreement is not judged to be good (NO), processing proceeds to Step S45 and the computer 30 repeats the processing of Steps S41 to S44 by increasing or decreasing the temporary numerical value assigned to each parameter of the Castro-Macosko model formula. On the other hand, in the case agreement is judged to be good (YES), processing proceeds to Step S46 and the computer 30 determines each parameter of the Castro-Macosko model formula.

Next, processing proceeds to Step S47 and the computer 30 fits each parameter of the Kamal model formula determined in Step S37 of FIG. 13 and each parameter of the Castro-Macosko model formula determined in Step S46 to the Castro-Macosko model formula, and generates a fitting curve of virtual viscosity behavior (Step S48). The generated fitting curve is then displayed on the image display device 30A of the computer 30, for example, as in FIG. 16 to be subsequently described (Step S28 of FIG. 8).

<<Viscosity Temperature Change Rate Calculation Step>>

The procedure of the viscosity temperature change rate calculation step is shown in Step S29 and S30 of FIG. 8. In Step S29, virtual viscosity behavior (viscosity temperature change) is calculated for a prescribed heating profile. A calculation formula of a curve of virtual viscosity behavior for a prescribed heating profile can be obtained by combining a reaction rate derived from measured values obtained in the manner previously described and fitting curves calculated by fitting of viscosity behavior. Namely, although the rate of temperature increase varies over time in the heating profile of FIGS. 22 and 23, virtual viscosity behavior for the rate of temperature increase for each prescribed elapsed time can be obtained according to the calculation formula of a curve of virtual viscosity behavior.

Next, in the viscosity temperature change rate calculation step of the method of predicting viscosity behavior of the present embodiment in Step S30 of FIG. 8, the rate of temperature change of viscosity of a thermosetting resin composition for a prescribed heating profile is calculated from the virtual viscosity behavior of the thermosetting resin composition, and the temperature is determined at which the rate of temperature change of viscosity becomes 30 Pa·sec/° C.

More specifically, the rate of temperature change of viscosity of a thermosetting resin composition is determined based on the rate of temperature increase for each prescribed elapsed time in a prescribed temperature profile, and the temperature at which the rate of temperature change of viscosity becomes 30 Pa·sec/° C. is determined by calculating the differential thereof.

<Materials of Thermosetting Resin Composition>

The thermosetting resin composition of the present invention contains a thermosetting resin, a curing agent and a fluxing agent. The thermosetting resin composition of the present invention is preferably a film-like thermosetting resin composition as a result of further containing a film forming agent. In addition, the thermosetting resin composition can further contain at least one member of the group consisting of a curing accelerator, elastomer, filler and coupling agent.

<Thermosetting Resin>

The thermosetting resin composition of the present invention contains a thermosetting resin. The thermosetting resin is preferably an epoxy resin and/or (meth)acrylate compound.

<Epoxy Resin>

The thermosetting resin contained in the thermosetting resin composition of the present invention is preferably an epoxy resin. The epoxy resin contained in the thermosetting resin composition of the present invention preferably includes a phenol novolac-type epoxy resin and further includes a liquid epoxy resin.

The thermosetting resin composition of the present invention contains a phenol novolac-type epoxy resin. As a result of the epoxy resin contained in the thermosetting resin composition of the present invention being a phenol novolac-type epoxy resin, in the case of treating under conditions required by underfill, a thermosetting resin composition can be more reliably obtained that can be used as underfill for obtaining favorable solder connectivity while suppressing the formation of voids.

The liquid epoxy resin contained in the thermosetting resin composition of the present invention imparts curability, heat resistance and adhesiveness to a semiconductor encapsulating film, and imparts durability to the semiconductor encapsulating film after curing. Examples of liquid epoxy resin include liquid bisphenol A-type epoxy resin, liquid bisphenol F-type epoxy resin, liquid naphthalene-type epoxy resin, liquid aminophenol-type epoxy resin, liquid biphenyl-type epoxy resin, liquid hydrogenated bisphenol-type epoxy resin, liquid alicyclic epoxy resin, liquid alcohol ether-type epoxy resin, liquid cyclic aliphatic epoxy resin and liquid fluorene-type epoxy resin. Liquid naphthalene-type epoxy resin, liquid bisphenol F-type epoxy resin, liquid bisphenol A-type epoxy resin, liquid aminophenol-type epoxy resin and cyclic biphenyl-type epoxy resin are preferable as liquid epoxy resins from the viewpoints of curability, heat resistance, adhesiveness and durability. In addition, the epoxy equivalent of the liquid epoxy resin is preferably 80 g/eq to 250 g/eq from the viewpoints of reactivity and cured density. Examples of commercially available products include bisphenol A-bisphenol F epoxy resin (trade name; EXA835LV) manufactured by DIC Corp., bisphenol A-type epoxy resin (trade name: YD-128) manufactured by Nippon Steel & Sumikin Chemical Co., Ltd., bisphenol F-type epoxy resin (trade name: YDF870GS) manufactured by Nippon Steel & Sumikin Chemical Co., Ltd., aminophenol-type epoxy resin (grade: JER630, JER630LSD) manufactured by Mitsubishi Chemical Corp., naphthalene-type epoxy resin (trade name: HP4032D) manufactured by DIC Corp., and epoxy resin (trade name: TSL9906) manufactured by Momentive Performance Materials Japan LLC. These liquid epoxy resins may be used alone or two or more types may be used in combination.

<(Meth)acrylate Compound>

The thermosetting resin contained in the thermosetting resin composition of the present invention is preferably a (meth)acrylate compound. A (meth)acrylate compound is an acrylic acid ester monomer and/or methacrylic acid ester monomer, or an oligomer thereof. Polyester acrylate and/or dimethylol tricyclodecane diacrylate is preferably used for the (meth)acrylate compound contained in the thermosetting resin composition of the present invention.

Examples of acrylic acid ester monomers and/or methacrylic acid ester monomers or oligomers thereof able to be used in the present invention include tris(2-hydroxyethyl)isocyanurate diacrylate and/or dimethacrylate, tris(2-hydroxyethyl)isocyanurate triacrylate and/or trimethacrylate, trimethylolpropane triacrylate and/or trimethacrylate or oligomers thereof, pentaerythritol triacrylate and/or trimethacrylate or oligomers thereof, dipentaerythritol polyacrylate and/or polymethacrylate, tris(acryloxyethyl)isocyanurate, caprolactone-modified tris(acryloxyethyl)isocyanurate, caprolactone-modified tris(methacryloxyethyl)isocyanurate, alkyl-modified dipentaerythritol polyacrylate and/or polymethacrylate, and caprolactone-modified dipentaerythritol polyacrylate and/or polymethacrylate. One type of these compounds may be used alone or two or more types may be used in combination.

<Curing Agent>

In the case the thermosetting resin contained in the thermosetting resin composition of the present invention is epoxy resin, the curing agent is that having the ability to cure the aforementioned epoxy resin and liquid epoxy resin. Examples of curing agents include phenol-based curing agents, amine-based curing agents and acid anhydride-based curing agents. Phenol-based curing agents are preferable for the curing agent from the viewpoints of reactivity and stability. Examples of phenol-based curing agents include phenol novolac and cresol novolac, with phenol novolac being preferable. Examples of amine-based curing agents include linear aliphatic amines, cyclic aliphatic amines, aliphatic-aromatic amines and aromatic amines. An aromatic amine is preferable for the amine-based curing agent. Examples of acid anhydride-based curing agents include tetrahydrophthalic anhydride, hexahydrophthalic anhydride, methyl tetrahydrophthalic anhydride, methyl hexahydrophthalic anhydride, methyl nadic anhydride, hydrogenated methyl nadic anhydride, trialkyl tetrahydrophthalic anhydride, methyl cyclohexene tetracarboxylic dianhydride, phthalic anhydride, trimellitic anhydride, pyromellitic anhydride, benzophenone tetracarboxylic acid dianhydride, ethylene glycol bisanhydrotrimellitate, glycerin bis(anhydrotrimellitate) monoacetate, dodecenyl succinic anhydride, aliphatic dibasic polyacid anhydrides, chlorendic anhydride, methyl butenyl tetrahydrophthalic anhydride, alkylated tetrahydrophthalic anhydride, methyl himic anhydride, succinic anhydride substituted with an alkenyl group and glutaric anhydride. Methyl butenyl tetrahydrophthalic anhydride is preferable for the acid anhydride-based curing agent. Examples of commercially available products include cresol novolac-type phenol resin curing agent (trade name: KA-1160) manufactured by DIC Corp., phenol curing agent (trade name: MEH8000, MEH8005) manufactured by Meiwa Plastic Industries, Ltd., amine curing agent (trade name: Kayahard A-A) manufactured by Nippon Kayaku Co., Ltd., acid anhydride (grade: YH306, YH307) manufactured by Mitsubishi Chemical Corp., and 3- or 4-methyl hexahydrophthalic anhydride (trade name: HN-5500) manufactured by Hitachi Chemical Co., Ltd. These curing agents may be used alone or two or more types may be used in combination.

In the case the thermosetting resin contained in the thermosetting resin composition of the present invention is a (meth)acrylate compound, the curing agent (polymerization reaction initiator) has the ability to cure the aforementioned (meth)acrylate compound. An organic hydroxide is preferably used for the acrylic resin curing agent. More specifically, "Percumyl D" and/or "Perbutyl E" manufactured by NOF Corp. can be used for the acrylic resin curing agent. An acrylic resin can be obtained by polymerizing the (meth)acrylate compound using a curing agent.

There are no particular limitations on the organic peroxide that can be used as a curing agent of the (meth)acrylate compound contained in the thermosetting resin composition of the present invention provided it is a substance that has a —O—O— bond in a molecule thereof. Examples of peroxides include ketone peroxides, peroxy ketals, hydroperoxides, dialkyl peroxides, diacyl peroxides, peroxy esters and peroxy carbonates. Among these, peroxy esters are used preferably. Specific examples of peroxy esters include 1,1,3,3-tetramethylbutyl peroxy-2-ethylhexanoate and t-butyl peroxyneodecanoate.

<Fluxing Agent>

The thermosetting resin composition of the present invention contains a fluxing agent. Favorable solder connectivity can be obtained as a result of the thermosetting resin composition of the present invention containing a fluxing agent. A commercially available compound having fluxing action can be used for the fluxing agent. Oxyquinoline is preferably used for the fluxing agent from the viewpoint of being able to obtain more favorable solder connectivity. Oxyquinoline manufactured by Wako Pure Chemical Industries, Ltd., for example, can be used for the fluxing agent.

<Film Forming Agent>

The thermosetting resin composition of the present invention preferably further contains a film forming agent. The thermosetting resin composition of the present invention can be obtained in the form of a film-like thermosetting resin composition as a result of further containing a film forming agent. As a result of being in the form of a film, in addition to improving workability and facilitating application to mounting substrates, application to semiconductor wafers is also made easier, thereby enabling application to a wider range of fabrication methods.

The film forming agent imparts flexibility to film-like thermosetting resin compositions used as semiconductor encapsulating films. Examples of film forming agents include phenoxy resins, polyimide resins, polyethylene resins, polystyrene resins, polyesters, polyethers, polyamides, polyether ester amides and acrylic-based resins (acrylic-based polymers). Phenoxy resins are preferable and biphenol F-type phenoxy resins are particularly preferable from the viewpoint of relaxation of internal stress of the thermosetting resin composition after curing. Here, a phenoxy resin refers to a high molecular weight polyhydroxy-polyether (thermoplastic resin) synthesized directly by a reaction between a divalent phenol and epichlorhydrin or by an addition polymerization reaction between a diglycidyl ether of a divalent phenol and a divalent phenol, and the weight average molecular weight thereof is 10,000 or more. The weight average molecular weight thereof is preferably 10,000 to 100,000 and more preferably 40,000 to 80,000. Here, weight average molecular weight refers to the value obtained using a calibration curve of standard polystyrene determined by gel permeation chromatography (GPC).

Examples of divalent phenols include bisphenol A, bisphenol F, bisphenol S, dihydroxynaphthalene, bisphenol D, bisphenol E, bisphenol Z, bisphenol fluorene, biscresol fluorene, biphenol, catechol, resorcin, hydroquinone, 2,5-di-t-buylhydroquinone, halogenated bisphenols such as brominated bisphenol A, 10-(2,5-dihydroxyphenyl)-10-dihydro-9-oxa-10-phosphaphenanthrene-10-oxide, 10-(2,7-dihydroxynaphthyl)-10-dihydro-9-oxa-10-phosphaphenanthrene-10-oxide, and phosphine-containing phenols such as diphenylphosphinyl hydroquinone, diphenylphosphinyl naphthoquinone, cyclooctylenephosphinyl-1,4-benzenediol or cyclooctylenephosphinyl-1,4-naphthalenediol. Examples of phenoxy resins include those produced by directly reacting these divalent phenols with epichlorhydrin or those synthesized by an addition polymerization reaction between the aforementioned divalent phenols and diglycidyl ether compounds thereof. More preferable examples of film forming agents include bisphenol A-type phenoxy resins, bisphenol F-type phenoxy resins and bisphenol A-bisphenol F-type polymerized phenoxy resins. If the film forming agent is a phenoxy resin, it is thought that stress between the semiconductor chip and substrate is relaxed as a result of relaxation of internal stress of the pre-applied semiconductor encapsulating film, while the presence of a film forming agent between the semiconductor chip and substrate is thought to improve adhesiveness there between. An example of a commercially available film forming agent is the bis F-type phenoxy resin (trade name: FX-316) manufactured by Nippon Steel & Sumikin Chemical Co., Ltd. One type of film forming agent may be used alone or two or more types may be used in combination.

<Elastomer>

The thermosetting resin composition of the present invention preferably further contains an elastomer. Particularly in the case the thermosetting resin contained in the thermosetting resin composition of the present invention is an epoxy resin, the thermosetting resin composition preferably further contains an elastomer.

In the thermosetting resin composition of the present invention, an elastomer (thermoplastic elastomer) contributes to film properties, adhesiveness and heat resistance in the case of using as underfill in a semiconductor chip thermocompression bonding step.

In the present invention, at least one type of elastomer selected from the group consisting of butadiene-acrylonitrile-methacrylic acid copolymer, styrene-butadiene block copolymer, styrene-ethylene/butylene-styrene block copolymer, styrene-isoprene-styrene block copolymer, polybutadiene and styrene-(ethylene-ethylene/propylene)-styrene block copolymer can be used for the elastomer. Among these, only one type may be used or two or more types may be used. The elastomer or elastomers used can be suitably selected corresponding to the characteristics to be imparted to the underfill. For example, a styrene-ethylene/butylene-styrene block copolymer is preferable in terms of imparting heat resistance to the underfill due to the high level of heat resistance thereof attributable to the high crystallinity of the -ethylene/butylene-moiety. On the other hand, since the crystallinity of the -(ethylene-ethylene/propylene)- moiety of a styrene-(ethylene-ethylene/propylene)-styrene block copolymer is low in comparison with the corresponding moiety of a styrene-ethylene/butylene-styrene block copolymer (-ethylene/butylene-moiety), adhesive strength to a substrate is higher in comparison with the styrene-ethylene/butylene block copolymer. In addition, since a styrene-butadiene block copolymer demonstrates a lower elastic modulus of the underfill and favorably fills in surface irregularities present on an adhered surface, adhesive strength of the underfill improves. In addition, flexibility of the underfill after curing is also superior. When comprehensively considering the performance described above, a butadiene-acrylonitrile-methacrylic acid copolymer is preferably used for the elastomer of the thermosetting resin composition of the present invention.

In the present invention, the content of the elastomer is preferably 3 parts by weight to 20 parts by weight and more preferably 5 parts by weight to 15 parts by weight based on 100 parts by weight of the thermosetting resin (such as a phenol novolac-type epoxy resin). In the case the elastomer content is less than 3 parts by weight, the film properties of the thermoplastic resin composition, and more specifically, the bending resistance of the film-like thermosetting resin composition alone, is inferior. In addition, the amount of resin flow during thermosetting becomes excessively large resulting in increased susceptibility to a lack of uniformity in film thickness of the thermosetting resin composition. On the other hand, in the case the elastomer content exceeds 20 parts by weight, since the content of other materials of a film of the thermoplastic resin composition film, and particularly the content of the thermosetting resin (such as a phenol novolac-type epoxy resin) becomes relatively low, heat resistance of a film of the thermosetting resin composition decreases. In addition, since compatibility with other materials of a film of the thermosetting resin composition decreases, the composition of a film of the thermosetting resin composition becomes non-uniform, and adhesiveness and mechanical strength of a film of the thermosetting resin composition decrease. From the above viewpoints, the elastomer content in the present invention is preferably 3 parts by weight to 20 parts by weight and more preferably 5 parts by weight to 15 parts by weight based on 100 parts by weight of the thermosetting resin.

<Filler>

The thermosetting resin composition of the present invention preferably further contains a filler.

The containing of a filler makes it possible to adjust the elastic modulus and coefficient of thermal expansion of a film-like thermosetting resin composition for semiconductor encapsulation after curing (semiconductor encapsulating film). Examples of fillers include silica fillers such as colloidal silica, hydrophobic silica, fine silica or nanosilica, aluminum nitride, alumina, silicon nitride and boron nitride. The filler is preferably a silica filler from the viewpoints of versatility, electrical characteristics and the like. In addition, there are no particular limitations on the average particle diameter of the filler (the average maximum diameter in the case of being non-spherical). The average particle diameter of the filler is preferably 0.05 µm to 50 µm in terms of uniformly dispersing the filler in the film-like thermosetting resin composition. In the case the average particle diameter of the filler is less than 0.5 µm, viscosity of the thermosetting resin composition increases during mounting resulting in the risk of poor flowability. In the case the average particle diameter of the filler exceeds 50 µm, it becomes difficult to make the filler uniformly present in the thermosetting resin composition while also resulting in the risk of difficulty in making connections between the semiconductor and substrate. The average particle diameter of the filler is more preferably 0.1 µm to 30 µm and even more preferably 0.1 µm to 5 µm. Examples of commercially available products include silica manufactured by Sakai Chemical Industry Co., Ltd. (trade name: Sciqas, average particle diameter: 0.1 µm), silica manufactured by Admatechs Co., Ltd. (trade name: SO-E2, average particle diameter: 0.5 µm), silica manufactured by Denka Co., Ltd. (trade name: FB-5D, average particle diameter: 5 µm) and silica manufactured by Fuso Chemical Co., Ltd. (trade name: SP03B, average particle diameter: 300 nm). Here, average particle diameter of the filler is measured with a dynamic light-scattering Nanotrac. One type of filler may be used alone or two or more types may be used in combination.

<Coupling Agent>

The thermosetting resin composition of the present invention preferably further contains a coupling agent.

The thermosetting resin composition preferably contains a coupling agent from the viewpoint of the adhesiveness of a liquid resin composition. Examples of coupling agents include phenylaminopropylsilane, 3-glycidoxypropyltrimethoxysilane, 3-aminopropyltrimethoxysilane, vinyltrimethoxysilane, p-styryltrimethoxysilane, 3-methacryloxypropylmethyltrimethoxysilane, 3-acryloxypropyltrimethoxysilane, 3-ureidopropyltriethoxysilane, 3-mercaptopropyltrimethoxysilane, bis(triethoxysilylpropyl)tetrasulfide and 3-isocyanatopropyltriethoxysilane. The coupling agent is preferably phenylaminopropylsilane, 3-glycidoxypropyltrimethoxysilane or 3-aminopropyltrimethoxysilane, and more preferably phenylaminopropylsilane, from the viewpoint of adhesiveness of a liquid resin composition. Although examples of commercially available products include KBM573 (phenylaminopropylsilane) manufactured by Shin-Etsu Chemical Co., Ltd. and KBM403, KBE903 or KB39103 manufactured by Shin-Etsu Chemical Co., Ltd., the coupling agent is not limited to these products. One type of coupling agent may be used alone or two or more types may be used in combination.

<Curing Accelerator>

The thermosetting resin composition of the present invention preferably further contains a curing accelerator. Particularly in the case the thermosetting resin contained in the thermosetting resin composition of the present invention is an epoxy resin, the thermosetting resin composition of the present invention preferably further contains a curing accelerator.

The incorporation of a curing accelerator makes it possible to control reactivity of the thermosetting resin composition. In addition, a curing accelerator is preferably a latent curing accelerator from the viewpoint of workability. Here, a latent curing accelerator refers to that which is obtained by microencapsulating a urethane resin and the like for the shell and using the curing accelerator for the core. A latent curing accelerator integrated into a master batch with an epoxy resin (such as a bisphenol A-type liquid epoxy resin) is preferable from the viewpoints of workability, curing rate and storage stability. As a result of subjecting to heat treatment at 50° C. to 100° C., the urethane resin serving as the shell of the latent curing accelerator integrated into a master batch with an epoxy resin is thought be suitably polymerized, thereby making it possible to further adjust workability, curing rate and storage stability. If the latent curing accelerator is subjected to heat treatment at a temperature lower than 50° C., stability during preheating and connectivity of flip-chip mounting become inadequate. If the latent curing accelerator is subjected to heat treatment at a temperature higher than 100° C., the master batch consisting of the epoxy resin and latent curing accelerator ends up being semi-cured or cured. The heat treatment temperature of the curing accelerator is preferably 60° C. to 100° C., more preferably 70° C. to 100° C. and even more preferably 70° C. to 90° C.

The duration of heat treatment of the curing accelerator is preferably 6 hours to 72 hours. Furthermore, the duration of heat treatment is preferably 48 hours or more in the case the heat treatment temperature of the curing accelerator is 50° C. The duration of heat treatment is preferably 48 hours or less and more preferably 12 hours or less in the case the heat treatment temperature of the curing accelerator is 90° C.

In addition, the reaction initiation temperature of the curing accelerator is preferably 110° C. to 150° C. and more preferably 110° C. to 142° C. Here, reaction initiation temperature is measured by differential scanning calorimetry (DSC). Here, reaction initiation temperature refers to the temperature at which a latent curing accelerator initiates a curing reaction in the thermosetting resin composition, and is observed during DSC as the temperature at which the curing accelerator begins to generate heat.

An imidazole compound microencapsulated with a urethane resin and the like is preferable as a latent curing accelerator from the viewpoint of storage stability. In addition, a microencapsulated modified imidazole curing accelerator or microencapsulated imidazole compound curing accelerator, obtained by dispersing in a liquid epoxy resin, such as a liquid bisphenol A-type epoxy resin, integrated into a master batch, is more preferable from the viewpoints of workability, curing rate and storage stability. Examples of imidazole compound curing accelerators include 2-methylimidazole, 2-undecylimidazole, 2-heptadecylimidazole, 2-ethyl-4-methylimidazole, 2-phenylimidazole, 2-phenyl-4-methylimidazole, 2,4-diamino-6-[2'-methylimidazolyl-(1')]-ethyl-s-triazine, 2-phenyl-4,5-dihydroxymethylimidazole, 2-phenyl-4-methyl-5-hydroxymethylimidazole and 2,3-dihydro-1H-pyrrolo[1,2-a]benzimidazole. Preferable examples of imidazole compound curing accelerators include 2,4-diamino-6-[2'-methylimidazolyl-(1')]-ethyl-s-triazine, 2,4-diamino-6-[2'-undecylimidazolyl-(1)]-ethyl-s-triazine and 2,4-diamino-6-[2'-ethyl-4'-methylimidazaolyl-(1')]-ethyl-s-ttriazine from the viewpoints of curing rate, workability and moisture resistance.

Commercially available latent curing accelerators integrated into a master batch with epoxy resin include microencapsulated modified imidazole (HX3088) manufactured by Asahi Kasei E-Materials Corp. and microencapsulated imidazole compound curing accelerators (trade name: Novacure 4982, (ultra-thick type), 3932 (middle-thick type), Novacure 4921 (thin type), HX3722 and HXA3932HP) manufactured by Asahi Kasei E-Materials Corp. The microencapsulated compound curing accelerator (trade name: Novacure 4982 (ultra-thick type) manufactured by Asahi Kasei E-Materials Corp. is preferable for use as a commercially available latent curing accelerator integrated into a master batch with an epoxy resin. One type of curing accelerator may be used alone or two or more types may be used in combination.

<Material Incorporated Amounts>

In the case the thermosetting resin contained in the thermosetting resin composition of the present invention is an epoxy resin, the incorporated amount of each material is preferably the incorporated amounts indicated below in order to obtain the aforementioned effect of adding each material to the thermosetting resin composition of the present invention. Namely, the thermosetting resin composition of the present invention preferably contains 20 parts by weight to 120 parts by weight of a film curing agent, 30 parts by weight to 100 parts by weight of a curing agent, 3 parts by weight to 20 parts by weight of an elastomer, 5 parts by weight to 50 parts by weight of a liquid epoxy resin, 50 parts by weight to 1000 parts by weight of a filler, 1 part by weight to 10 parts by weight of a coupling agent, 5 parts by weight to 100 parts by weight of a fluxing agent, and 5 parts by weight to 100 parts by weight of a curing accelerator based on 100 parts by weight of a phenol novolac-type epoxy resin. The thermosetting resin composition of the present invention more preferably contains 40 parts by weight 90 parts by weight of a film forming agent, 35 parts by weight to 80 parts by weight of a curing agent, 5 parts by weight to 15 parts by weight of an elastomer, 8 parts by weight to 40 parts by weight of a liquid epoxy resin, 100 parts by weight to 600 parts by weight of a filler, 1.5 parts by weight to 5 parts by weight of a coupling agent, 10 parts by weight to 70 parts by weight of a fluxing agent and 10 parts by weight to 60 parts by weight of a curing accelerator based on 100 parts by weight of a phenol novolac-type epoxy resin. Furthermore, among the aforementioned incorporated amounts, the incorporated amount of curing accelerator refers to the weight of the curing accelerator serving as the active ingredient obtained by subtracting the amount of epoxy resin when integrating into a master batch.

In the case the thermosetting resin contained in the thermosetting resin composition of the present invention is a (meth)acrylate compound, the incorporated amount of each material is preferably the incorporated amounts indicated below in order to obtain the aforementioned effect of adding each material to the thermosetting resin composition of the present invention. Namely, the thermosetting resin composition of the present invention preferably contains 50 parts by weight to 120 parts by weight of a film forming agent, 0.1 parts by weight to 5 parts by weight of a curing agent, 50 parts by weight to 500 parts by weight of a filler, 0.05 parts by weight to 5 parts by weight of a coupling agent and 0.1 part by weight to 10 parts by weight of a fluxing agent based on 100 parts by weight of a (meth)acrylate compound. The thermosetting resin composition of the present invention more preferably contains 60 parts by weight to 100 parts by weight of a film forming agent, 0.5 parts by weight to 5 parts by weight of a curing agent, 100 parts by weight to 300 parts by weight of a filler, 0.5 parts by weight to 5 parts by weight of a coupling agent and 0.1 part by weight to 10 parts by weight of a fluxing agent based on 100 parts by weight of a (meth)acrylate compound.

<Method of Producing Thermosetting Resin Composition>

The following provides an explanation of the method of producing a thermosetting resin composition of the present invention.

The present invention is a method of producing a film-like thermosetting resin composition for encapsulating a semiconductor containing a thermosetting resin, a curing agent, a fluxing agent and a film forming agent. The method of producing a thermosetting resin composition of the present invention comprises a step for selecting materials for the thermosetting resin composition and a step for mixing the materials for the thermosetting resin composition. The thermosetting resin contained in the thermosetting resin composition of the present invention is preferably an epoxy resin and/or (meth)acrylate compound.

<Step for Selecting Materials for Thermosetting Resin Composition>

The method of producing a thermosetting resin composition of the present invention includes a step for selecting materials for the thermosetting resin composition. As was previously described, materials for the thermosetting resin composition comprise materials that compose the thermosetting resin composition of the present invention. When selecting materials for the thermosetting resin composition, materials for the thermosetting resin composition are selected so that the temperature at which the rate of temperature change of viscosity when temperature is increased according to a prescribed heating profile reaches 30 Pa·s/° C. is 200° C. to 250° C. In the method for producing a thermosetting resin composition of the present invention, the rate of temperature change of viscosity when temperature is increased according to a prescribed heating profile can be obtained by the previously described method of predicting viscosity behavior (the method of predicting viscosity behavior of the present embodiment).

In the method of producing a thermosetting resin composition of the present invention, the thermosetting resin composition preferably further contains at least one member selected from the group consisting of a curing accelerator, an elastomer, a filler and a coupling agent in addition to the thermosetting resin, curing agent, fluxing agent and film forming agent. In addition, in the method of producing a thermosetting resin composition of the present invention, in the case the thermosetting resin includes an epoxy resin, a liquid epoxy resin is further preferably contained as an epoxy resin. These materials are the same as those explained regarding the thermosetting resin composition of the present invention. The incorporation of the materials of the thermosetting resin composition is also as previously described. Furthermore, in the method of producing a thermosetting resin composition of the present invention, the materials for the thermosetting resin composition and the incorporation thereof can be suitably selected so that the temperature at which the rate of temperature change of viscosity when temperature is increased according to a prescribed heating profile reaches 30 Pa·s/° C. is 200° C. to 250° C.

The method of producing a thermosetting resin composition of the present invention includes a step for mixing materials for the thermosetting resin composition. The resin composition of the present invention can be produced by stirring, melting, mixing and dispersing the aforementioned prescribed materials while simultaneously or separately subjecting to heat treatment as necessary. Although there are no particular limitations on the devices used for this mixing, stirring, dispersal and the like, a crusher, triple roll mill, ball mill, planetary mixer or bead mill and the like equipped with a stirrer and heating device can be used. In addition, these devices may also be suitably used in combination.

The thermosetting resin composition of the present invention can be produced in the manner described above.

EXAMPLES

Although the following provides an explanation of the present invention using examples thereof, the present invention is not limited thereto. Furthermore, in the following examples, the terms "parts" and "%" indicate parts by weight and percent by weight unless specifically indicated otherwise.

[Verification of Reproducibility of Virtual Viscosity Behavior]

Virtual viscosity behavior of a thermosetting resin composition was obtained with the previously described method of predicting viscosity behavior of the present embodiment. The following verification was carried out in order to confirm that the rate of temperature change of the viscosity of the thermosetting resin composition for a prescribed rate of temperature increase can be calculated from virtual viscosity behavior.

Reproducibility of virtual viscosity behavior calculated by the computer 30 was verified for a prescribed thermosetting resin composition by setting the prescribed heating profile to 3° C./min so as to be able to be measured with the rheometer 20 in the virtual viscosity behavior calculation step of the method of predicting virtual viscosity behavior of the present embodiment. Namely, the computer 30 was made to calculate the virtual viscosity behavior of the aforementioned thermosetting resin composition under conditions of a rate of temperature increase of 3° C./min based on the respective fitting curves for each rate of temperature increase obtained in Steps S24 to S26 shown in FIG. 8. On the other hand, viscosity behavior of the aforementioned thermosetting resin composition was actually measured under conditions of a rate of temperature increase of 3° C./min followed by comparing the fitting curves of the predicted virtual viscosity behavior with the measurement data.

Figure 15A:
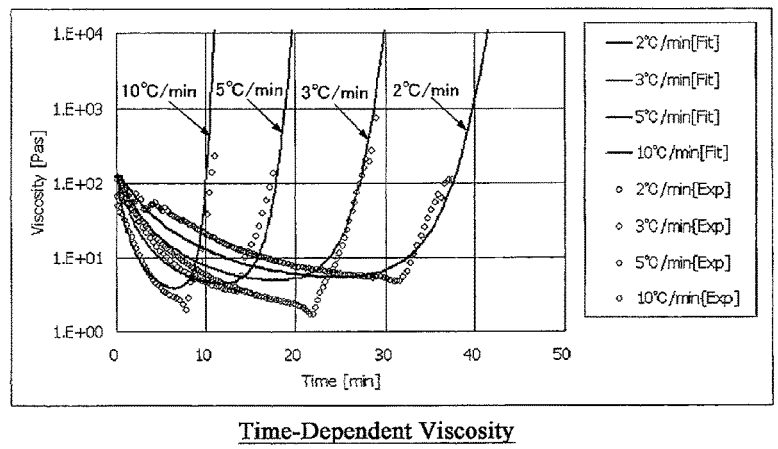
FIG. 15(a) is a graph showing actual measurement data for the relationship between viscosity and time and fitting curves of predicted virtual viscosity behavior.
Figure 15B:
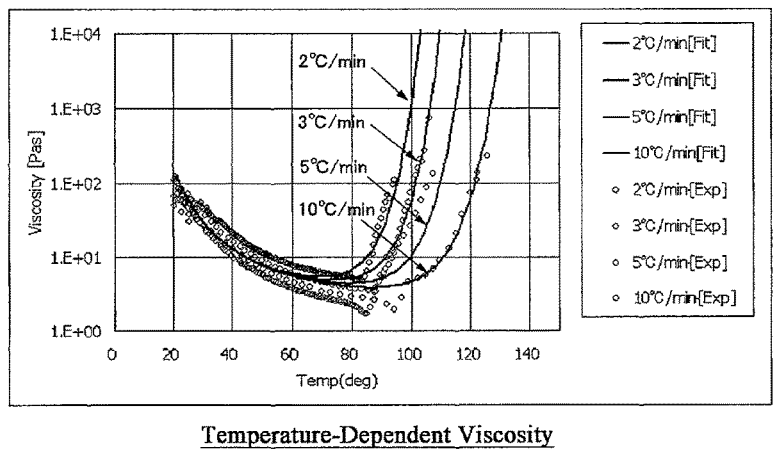
FIG. 15(b) is a graph showing actual measurement data for the relationship between viscosity and time and fitting curves of predicted virtual viscosity behavior.

The results of the comparison are shown in FIGS. 15(a) and 15(b). FIG. 15(a) is a graph showing measurement data for the relationship between viscosity and time (time-dependent viscosity) and fitting curves of the predicted virtual viscosity behavior, while FIG. 15(b) is a graph showing measurement data for the relationship between viscosity and temperature (temperature-dependent viscosity) and fitting curves of the predicted virtual viscosity behavior. In these graphs, when focusing on the measurement data for a rate of temperature increase of 3° C./min and the corresponding fitting curves thereof, the fitting curves for the rate of temperature increase of 3° C./min calculated by the computer 30 can be seen to closely agree with the measurement data.

Conditions currently required by non-conductive paste used in the thermal compression bonding technique in the case of mounting conditions having a tact time of 4 seconds, for example, consist of increasing the temperature to 260° C. at a rate of temperature increase of 1800° C./min (approximately 30° C./sec). Under the present circumstances, the formation of voids presents problems at a tact time of 4 seconds. As a result of conducting extensive studies, the inventors of the present invention determined that, in order to suppress the formation of voids, it is advantageous for the resin to exhibit high viscosity in the vicinity of the melting temperature of solder of 220° C. However, in the case of current measurement methods, there is no choice but to examine this issue on the basis of data obtained by actually measuring temperature-dependent viscosity at a rate of temperature increase of 3° C./min, thus making it difficult to evaluate viscosity.

Figure 16:
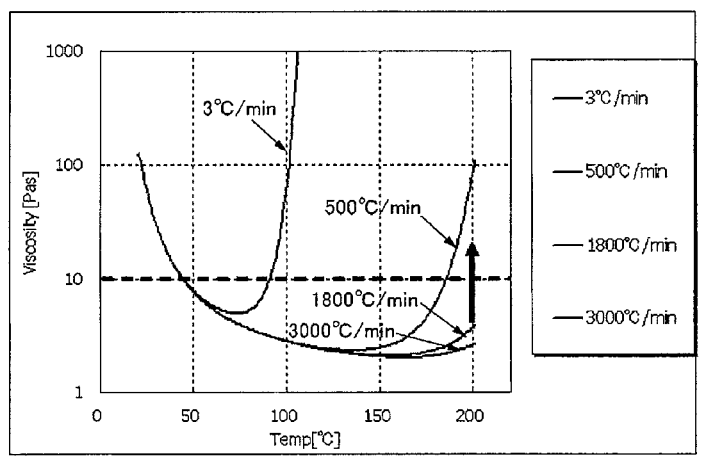
FIG. 16 is a graph showing the respective fitting curves predicting virtual viscosity behavior when setting the rate of temperature increase to 3° C./min, 500° C./min, 1800°
Figure 17A:
Figure 17B:
Figure 17C:
Figure 17D:
Figure 17E:
Figure 17F:

Therefore, a fitting curve of predicted virtual viscosity behavior for a rate of temperature increase of 1800° C./min obtained according to the method of predicting viscosity behavior of a thermosetting resin composition of the present embodiment is shown in FIG. 16. Prediction results for rates of temperature increase of 3° C./min, 500° C./min and 3000° C./min are also shown for the sake of comparison. Although viscosity increases starting in the vicinity of 200° C., according to the fitting curve of predicted virtual viscosity behavior for a rate of temperature increase of 1800° C./min, viscosity remains extremely low without increasing in the vicinity of 200° C. and voids are thought to form. Thus, in order to develop a thermosetting resin composition that suppresses the formation of voids, it was suggested that improvements be made such that viscosity in the vicinity of 200° C. increased as indicated by the arrow in the drawing.

On the basis of this verification, it was suggested that the rate of temperature change of the viscosity of a thermosetting resin composition for a prescribed heating profile can be calculated from virtual viscosity behavior of the thermosetting resin composition using the aforementioned method of predicting viscosity behavior for the prescribed heating profile.

Although there are no particular limitations on the prescribed heating profile, it is preferable to use the rate of temperature increase (temperature profile) actually used. For example, in the case of a thermosetting resin composition for thermal compression, the rate of temperature increase (prescribing heating temperature profile) applied during thermal compression is preferable.

In this manner, according to the method of predicting viscosity behavior of a thermosetting resin composition according to the present embodiment, it was clearly determined that the number of man-hours required to develop a thermosetting resin composition for use as underfill can be reduced considerably, improvements taking into consideration the mechanism of the thermosetting resin composition can be made, and the development of resin materials offering new advantages can be deployed.

Examples 1 to 6 and Comparative Examples 1 to 4

The thermosetting resin compositions of Examples 1 to 6 and Comparative Examples 1 to 4 were prepared according to the formulations of components (A) to (I) shown in Tables 1 and 2. Table 3 indicates the specific material, manufacturer and product number of each component. Furthermore, the curing accelerator of component (I) in the form of HX3088 manufactured by Asahi Kasei E-Materials Corp. (to be simply referred to as "HX3088") was a curing accelerator for which ⅓ of the weight thereof is a microencapsulated modified imidazole acting as a curing accelerator, while ⅔ of the weight thereof is a bisphenol A-type liquid epoxy resin used for integrating into a master batch. Consequently, in Tables 1 and 2, the weight of the microencapsulated modified imidazole acting as a curing accelerator is shown in the column entitled "(I) Curing Accelerator". The weight of bisphenol A-type liquid epoxy resin contained in HX3088 is indicated as "(J) Bisphenol A-type Liquid Epoxy Resin" in Tables 1 and 2.

The film forming agent (A), phenol novolac-type epoxy resin (B), curing agent (C) and elastomer (D) shown in Table 3 were dissolved in methyl ethyl ketone to a concentration of 50% by weight. Next, each of the materials dissolved in methyl ethyl ketone were mixed so that the total of these materials achieved the weight ratios of Tables 1 and 2, and the liquid epoxy resin (E), filler (F), coupling agent (G) and fluxing agent (H) were then added and dispersed therein so as to achieve the weight ratios shown in Tables 1 and 2. Following dispersion, a mixture of the bisphenol A-type epoxy resin (J) and the curing accelerator (I) (master batch, HX3088) was further added and stirred to uniformity to obtain the coating varnishes containing materials at the prescribed weight ratios shown in Tables 1 and 2. Next, the coating varnish was applied to polyethylene terephthalate (PET) having a thickness of 50 μm that was subjected to release treatment followed by drying for 10 minutes at 80° C. to remove the methyl ethyl ketone. As a result, a film-like thermosetting resin composition was obtained having a thickness of 35 μm.

<Film Characteristics>

The film characteristics of the film-like thermosetting resin compositions obtained in the manner described above were evaluated by evaluating crack resistance and surface flatness. Crack resistance was evaluated by cutting the film formed on PET to a width of 10 mm with a film cutter followed by checking for the occurrence of cracking or chipping (defects) in the lateral surface of the film. Film found to be free of the occurrence of defects was evaluated as "defect free" while film found to contain defects was evaluated as "defective".

Surface flatness was evaluated by visually observing the film formed on PET to check for the occurrence of concaves and streaks (defects). Film found to be free of the occurrence of defects was evaluated as "defect free" while film found to contain defects was evaluated as "defective".

As shown in Tables 1 and 2, crack resistance and surface flatness of the film-like thermosetting resin compositions of Examples 1 to 6 and Comparative Examples 1 to 4 were favorable and were free of the occurrence of defects. Thus, the film-like thermosetting resin compositions of Examples 1 to 6 and Comparative Examples 1 to 4 can be said to demonstrate film characteristics that enable them to be used for mounting semiconductor chips.

<Rate of Temperature Change of Viscosity>

The rates of temperature change of viscosity were calculated when the film-like thermosetting resin compositions of Examples 1 to 6 and Comparative Examples 1 to 4 were heated at a prescribed rate of temperature increase (prescribed heating profile shown in FIGS. 22 and 23). The temperature at which the rate of temperature change of viscosity becomes 30 Pa·s/° C. was then determined from the calculated rate of temperature increase of viscosity.

More specifically, virtual viscosity behavior of the thermosetting resin compositions under conditions of a prescribed heating profile was calculated based on the respective fitting curve for each rate of temperature increase obtained in Steps S24 to S26 shown in FIG. 8. FIG. 19 shows the rates of temperature change of viscosity of the thermosetting resin compositions of Examples 1 to 6 and Comparative Examples 1 to 4 calculated in this manner for the prescribed heating profile shown in FIGS. 22 and 23.

Next, the rates of temperature change of viscosity of the thermosetting resin compositions for the prescribed heating profile were determined by calculating the differentials of the curves of viscosity temperature change shown in FIG. 19. FIGS. 20 and 21 show the rates of change of viscosity of the thermosetting resin compositions of Examples 1 to 6 and Comparative Examples 1 to 4. The temperature at which the rate of temperature change of viscosity becomes 30 Pa·s/° C. was then determined from the results shown in FIGS. 20 and 21. Furthermore, the case in which the temperature at which the rate of temperature change of viscosity becomes 30 Pa·s/° C. is 200° C. to 250° C. is indicated with dotted lines for reference purposes. The temperature at which the rate of temperature change of viscosity becomes 30 Pa·s/° C. can be said to be 200° C. to 250° C. if the curves of Examples 1 to 6 and Comparative Examples 1 to 4 cross the dotted lines of FIGS. 20 and 21.

The rates of temperature change of viscosity of the thermosetting resin compositions of Examples 1 to 6 and Comparative Examples 1 to 4 when increasing the temperature according to a prescribed heating profile were obtained in the manner described above. Table 4 indicates the temperature (° C.) at which the rate of temperature change of viscosity reaches 30 Pa·s/° C. when temperature was increased according to a prescribed heating profile. The temperature at which the rate of temperature change of viscosity reaches 30 Pa·s/° C. during a prescribed rate of temperature increase was within the range of 200° C. to 250° C. in Examples 1 to 6 and Comparative Examples 1 and 2. In the case of Examples 1 to 6, the temperature at which the rate of temperature change of viscosity reaches 30 Pa·s/° C. during a prescribed rate of temperature increase was within the range of 242.2° C. to 247.5° C. In the case of Comparative Example 3, rate of temperature change of viscosity during a prescribed rate of temperature increase did not reach 30 Pa·s/° C. over a range up to 257° C.

[Fabrication of Test Pieces Mounted with Semiconductor Chip]

A semiconductor chip having a width of 7.3 mm, length of 7.3 mm and height of 125 μm was prepared on which 544 bumps 30 μm were formed at a pitch of 50 μm (Si chip). The bumps consisted of copper bumps in which the upper portions thereof were solder plated with AgSn. In addition, an organic substrate having a thickness of 360 μm was prepared that was provided with electrodes corresponding to the pattern of the bumps on the semiconductor chip. This substrate was then heat-dried in a nitrogen atmosphere.

Following completion of heat-drying of the substrate, the fabricated films (test pieces of Examples 1 to 6 and Comparative Examples 1 to 4) were cut into squares measuring about 8 mm on a side and placed at the semiconductor chip mounting position on the substrate followed by laminating with a laminator (MLP500/600 manufactured by Meiki Co., Ltd.). Following lamination, the laminate was heated using the flip-chip bonder (Model No. FCB3) manufactured by Panasonic Factory Solutions Co., Ltd. to connect the semiconductor chip. The temperature profile used during heating is as shown in FIGS. 22 and 23. In addition, a load of 100 N was also applied in addition to heat when connecting the semiconductor chip. Subsequently, post-curing was carried out by heat-treating for 1 hour at 165° C. Test pieces of Examples 1 to 6 and Comparative Examples 1 to 4 mounted with a semiconductor chip were fabricated in the manner described above.

[Mountability Test]

<Observation with Constant-Depth Mode Scanning Acoustic Microscope (C-SAM)>

Images of the test pieces of Examples 1 to 6 and Comparative Examples 1 to 4 mounted with semiconductor chips were observed with a constant-depth mode scanning acoustic microscope (C-SAM). The Model FS300III manufactured by Hitachi Power Solutions Co., Ltd. was used for the C-SAM. Whether or not voids formed in the thermosetting resin composition beneath the semiconductor chip was observed with the C-SAM. The ratio of the number of test pieces in which voids were observed to the number of test pieces is shown in the row entitled "C-SAM" of the parameter entitled "Voids" of the Mountability Test in Tables 1 and 2. For example, a ratio of "0/7" indicates that voids were observed in 0 of 7 test pieces. The same denotation method is used for other evaluation parameters as well.

<Surface Grinding Test>

The chip portions of the test pieces of Examples 1 to 6 and Comparative Examples 1 to 4 mounted with semiconductor chips (2 test pieces each) were removed by grinding followed by observing voids in the solder resist openings surrounding the semiconductor chip with an optical microscope. Voids extending over gaps between wires in the solder resist openings surrounding the semiconductor chip of the test piece were observed particularly carefully. Copper wires treated with organic solid preservative (OSP) were formed at a wiring width of 30 μm and wiring pitch of 50 μm in the solder resist openings. The ratio of the number of test pieces in which voids were observed to the number of test pieces (n=2) is shown in the row entitled "Surface grinding" of the parameter entitled "Voids" of the Mountability Test in Tables 1 and 2.

<Continuity Test>

Resistance values were measured between resistance measurement pads of test pieces mounted with semiconductor chips (number of test pieces: 7). The design value for resistance between resistance measurement pads of test pieces having favorable connectivity between the semiconductor chip and substrate is 30Ω. Those test pieces for which resistance between the resistance measurement pads was 28Ω to 32Ω were evaluated as acceptable, while those in which the resistance was not within the range of 28Ω to 32Ω were evaluated as unacceptable. The ratio of the number of unacceptable test pieces to the number of test pieces (n=7) is shown in the row entitled "Resistance" of the parameter entitled "Continuity" of the Mountability Test in Tables 1 and 2.

[Moisture Absorption Resistance Reflow Test]

<Observation with C-SAM>

Images of the test pieces of Examples 1 to 6 and Comparative Examples 1 to 4 mounted with semiconductor chips (number of test pieces: 5) were observed by scanning acoustic microscope (C-SAM) and the absence of void formation was confirmed. The Model FS300III manufactured by Hitachi Power Solutions Co., Ltd. was used for the C-SAM. Subsequently, the test pieces were allowed to absorb moisture for 192 hours in a high-temperature, high-humidity chamber (temperature: 30° C., humidity: 60% RH). After absorbing moisture, the test pieces were repeatedly passed through a reflow oven at a maximum temperature of 260° C. three times followed by again observing images of the test pieces in the same manner as described above. Those test pieces in which voids had formed in the resin composition following moisture absorption and reflow were evaluated as unacceptable. The ratio of the number of unacceptable test pieces to the number of test pieces (n=5) is shown in the row entitled "C-SAM" of the parameter entitled "Voids" of Moisture Absorption Resistance Reflow in Table 1.

<Continuity Test>

Resistance values were measured between resistance measurement pads of the test pieces mounted with semiconductor chips of Examples 1 to 6 (number of test pieces: 5) that were subjected to the same treatment as that during C-SAM observation in the aforementioned moisture absorption resistance reflow test. Those test pieces for which resistance between the resistance measurement pads was 28Ω to 32Ω were evaluated as acceptable, while those in which the resistance was not within the range of 28Ω to 32Ω were evaluated as unacceptable. The ratio the number of unacceptable test pieces to the number of test pieces (n=5) is shown in the row entitled "Resistance" of the parameter entitled "Continuity" of Moisture Absorption Resistance Reflow in Table 1.

The test results are shown in Table 1. In summary of the test results, all of Examples 1 to 6 demonstrated favorable electrical continuity and voids were not formed in the mountability test. In addition, results were also favorable for the moisture absorption resistance reflow test, with the test pieces demonstrating a high degree of reliability. In contrast, voids formed during the mountability test in Comparative Example 1 that did not incorporate the curing agent (C). In addition, electrical continuity decreased in Comparative Example 2 that did not incorporate the fluxing agent (H). In addition, voids formed in the mountability test in Comparative Examples 3 and 4, for which the temperature at which the rate of temperature change of viscosity when temperature is increased according to a prescribed heating profile reaches 30 Pa·s/° C. was outside the range of 200° C. to 250° C., while electrical continuity decreased further in Comparative Example 3.

Example 7, Example 8 and Comparative Example 5

Thermosetting resin compositions of Example 7, Example 8 and Comparative Example 5 were prepared according to the formulations of components (a), (b-1), (b-2), (c-1), (c-2), (f), (g) and (H) shown in Table 5. Table 6 indicates the specific material, manufacturer and product number of each component. Furthermore, component (H) in Table 6 is the same as component (H) of Table 2. Furthermore, components (b-1) and (b-2) in Tables 5 and 6 are acrylate compounds. Table 5 indicates the incorporated amount of other components (parts by weight) based on value of 100 parts by weight for the total amount of the acrylate compounds (b-1)

and (b-2). In addition, components (c-1) and (c-2) of Tables 5 and 6 indicate curing agents (polymerization initiators).

The film forming agent (A) shown in Table 6 was dissolved in methyl ethyl ketone to a concentration of 50% by weight. Next, each material was added, mixed and dispersed in the methyl ethyl ketone having the film forming agent (A) dissolved therein to obtain a coating varnish containing the materials shown in Table 5 at prescribed weight ratios. Next, the coating varnish was applied to polyethylene terephthalate (PET) having a thickness of 50 μm that was subjected to release treatment followed by drying for 10 minutes at 70° C. to remove the methyl ethyl ketone. As a result, a film-like thermosetting resin composition was obtained having a thickness of 35 μm.

<Film Characteristics>

The film characteristics of the film-like thermosetting resin compositions of Example 7, Example 8 and Comparative Example 5 obtained in the manner described above were evaluated by evaluating crack resistance and surface flatness. The film characteristics of Example 7, Example 8 and Comparative Example 5 were evaluated in the same manner as evaluation of the film characteristics of the aforementioned Examples 1 to 6 and Comparative Examples 1 to 4.

<Rate of Temperature Change of Viscosity>

The rates of temperature change of viscosity when increased in temperature according to a prescribed heating profile during thermal compression bonding of the film-like thermosetting resin compositions of Example 7, Example 8 and Comparative Example 5 were calculated using the aforementioned method of predicting viscosity behavior of the present embodiment followed by determining the temperature at which the rate of temperature change of viscosity becomes 30 Pa·s/° C. Furthermore, the prescribed heating profile refers to a heating profile complying with the heating profile shown in FIGS. 22 and 23, and although it is not completely identical, the heating profile can be considered to be identical to the heating profile shown in FIGS. 22 and 23 within the range of error. Thus, calculation of the rates of temperature change of viscosity of Example 7, Example 8 and Comparative Example 5 and subsequent determination of the temperature at which the rate of temperature change of viscosity becomes 30 Pa·s/° C. can be considered to have been carried out in the same manner as in the case of the aforementioned Examples 1 to 6 and Comparative Examples 1 to 4.

More specifically, virtual viscosity behavior of the thermosetting resin composition was calculated under conditions of a prescribed heating profile based on the respective fitting curves for each rate of temperature increase obtained in Steps S24 to S26 shown in FIG. 8. The rates of temperature change of viscosity of the thermosetting resin compositions of Example 7, Example 8 and Comparative Example 5 for a heating profile considered to be identical to the prescribed heating profile shown in FIGS. 22 and 23 (to be simply referred to as the "prescribed heating profile") are shown in FIG. 24. Namely, the prescribed heating profile used in Example 7, Example 8 and Comparative Example 25 consisted of increasing temperature from 145° C. to 258° C. in 6 seconds. More specifically, according to the prescribed heating profile, temperature was increased from 145° C. to 152° C. in 1 second followed by increasing temperature from 152° C. to 253° C. in 4 seconds.

Next, the rates of temperature change of viscosity of the thermosetting resin compositions for a prescribed heating profile were determined by calculating the differentials of curves of the temperature change of viscosity shown in FIG. 24. FIG. 25 indicates the rates of temperature change of viscosity of the thermosetting resin compositions of Example 7, Example 8 and Comparative Example 5. The temperature at which the rate of temperature change of viscosity becomes 30 Pa·s/° C. was then determined from the results shown in FIG. 25. Furthermore, the case in which the temperature at which the rate of temperature change of viscosity becomes 30 Pa·s/° C. is 200° C. to 250° C. is indicated in FIG. 25 with dotted lines for reference purposes. The temperature at which the rate of temperature change of viscosity becomes 30 Pa·s/° C. can be said to be 200° C. to 250° C. if the curves of Example 7, Example 8 and Comparative Example 5 cross the dotted line of FIG. 25.

The rates of temperature change of viscosity of the thermosetting resin compositions of Example 7, Example 8 and Comparative Example 5 when increasing the temperature according to a prescribed heating profile were obtained in the manner described above. Table 7 indicates the temperature (° C.) at which the rate of temperature change of viscosity reaches 30 Pa·s/° C. when temperature was increased according to a prescribed heating profile. The temperature at which the rate of temperature change of viscosity reaches 30 Pa·s/° C. during a prescribed rate of temperature increase was 220.4° C. and 224.1° C., respectively, in the case of Example 7 and Example 8, and these temperatures were within the range of 200° C. to 250° C. In the case of Comparative Example 5, the temperature at which the rate of temperature change of viscosity reaches 30 Pa·s/° C. during a prescribed rate of temperature increase was 198.4° C., which was outside the range of 200° C. to 250° C.

Test pieces mounted with semiconductor chips were fabricated using the thermosetting resin compositions of Example 7, Example 8 and Comparative Example 5 in the same manner as in the case of the aforementioned Examples 1 to 6 and Comparative Examples 1 to 4 followed by carrying out a mountability test. Moreover, images of the test pieces of Example 7, Example 8 and Comparative Example 5 mounted with semiconductor chips were observed by C-SAM in the same manner as in the case of the aforementioned Examples 1 to 6 and Comparative Examples 1 to 4 to observe whether or not voids had formed in the thermosetting resin composition beneath the semiconductor chip.

<Surface Grinding Test and Continuity Test>

A surface grinding test and continuity test were carried out using test pieces of Example 7, Example 8 and Comparative Example 5 mounted with semiconductor chips in the same manner as in the case of the aforementioned Examples 1 to 6 and Comparative Examples 1 to 4.

<Moisture Absorption Resistance Reflow Test>

The formation of voids in the resin compositions was evaluated in a moisture absorption resistance reflow test by observing images by C-SAM after absorbing moisture using the test pieces of Example 7, Example 8 and Comparative Example 5 in the same manner as in the case of the aforementioned Examples 1 to 6 and Comparative Example 1 to 4. Moreover, a continuity test was carried out in the same manner as in the case of the aforementioned Examples 1 to 6 and Comparative Examples 1 to 4 using the test pieces of Example 7, Example 8 and Comparative Example 5.

The test results are shown in Table 5. In summary of the test results of Example 7, Example 8 and Comparative Example 5, voids did not form during the mountability test in Example 7 and Example 8. In addition, electrical continuity of Example 7 and Example 8 was favorable. In addition, the results of the moisture absorption resistance reflow test were also favorable and demonstrated a high degree of reliability. In contrast, Comparative Example 5, in which the temperature at which the rate of temperature change of viscosity reaches 30 Pa·s/° C. for a prescribed heating profile is outside the range of 200° C. to 250° C., demonstrated a decrease in electrical continuity despite the absence of the formation of voids in the mountability test.

As described above, the thermosetting resin composition of the present invention can be in the form of a film having superior workability, handling ease and accommodation of narrow pitch, enables soldering connections to be made between substrate wiring and the solder bumps of a semiconductor chip in a short period of time while eliminating voids between the semiconductor chip and substrate, and is able to suppress the formation of voids in a moisture absorption resistance reflow test after curing. Consequently, it allows the obtaining of a highly reliable semiconductor device by a pre-application-type flip-chip bonding process at low cost and low energy, thereby making it extremely useful.

TABLE 1

| Formulation (parts by weight) | | | Example 1 | Example 2 | Example 3 | Example 4 | Example 5 | Example 6 |
|---|---|---|---|---|---|---|---|---|
| (A) Film forming agent | | | 53.1 | 66.4 | 53.1 | 53.1 | 48.0 | 82.5 |
| (B) Phenol novolac-type epoxy resin | | | 100.0 | 100.0 | 100.0 | 100.0 | 100.0 | 100.0 |
| (C) Curing agent | | | 40.0 | 75.0 | 40.0 | 39.7 | 45.8 | 62.1 |
| (D) Elastomer | | | 8.1 | 10.2 | 8.1 | 7.6 | 7.3 | 12.6 |
| (E) Liquid epoxy resin | | | 11.9 | 14.8 | 34.4 | 12.1 | 10.7 | 18.4 |
| (F) Filler | | | 312.5 | 390.6 | 312.5 | 133.9 | 282.5 | 485.4 |
| (G) Coupling agent | | | 2.5 | 3.1 | 2.5 | 2.7 | 2.3 | 3.9 |
| (H) Fluxing agent | | | 38.8 | 48.4 | 38.8 | 39.3 | 15.8 | 60.2 |
| (I) Curing accelerator | | | 19.4 | 24.2 | 11.9 | 19.3 | 17.5 | 48.5 |
| (J) Bisphenol A-type liquid epoxy resin | | | 38.8 | 48.4 | 23.8 | 38.7 | 35.0 | 97.1 |
| Total (parts by weight) | | | 625.0 | 781.3 | 625.0 | 446.4 | 565.0 | 970.9 |
| Film characteristics | | Crack resistance | Good | Good | Good | Good | Good | Good |
| | | Surface flatness | Good | Good | Good | Good | Good | Good |
| Initial | Voids | C-SAM | 0/7 | 0/7 | 0/7 | 0/7 | 0/7 | 0/7 |
| | | Surface grinding | 0/2 | 0/2 | 0/2 | 0/2 | 0/2 | 0/2 |
| | Continuity | Resistance | 0/7 | 0/7 | 0/7 | 0/7 | 0/7 | 0/7 |
| Moisture Absorption | Voids | C-SAM | 0/5 | 0/5 | 0/5 | 0/5 | 0/5 | 0/5 |
| Resistance Reflow | Continuity | Resistance | 0/5 | 0/5 | 0/5 | 0/5 | 0/5 | 0/5 |

TABLE 2

| Formulation (parts by weight) | | | Comparative Example 1 | Comparative Example 2 | Comparative Example 3 | Comparative Example 4 |
|---|---|---|---|---|---|---|
| (A) Film forming agent | | | 37.9 | 41.7 | 37.6 | 53.1 |
| (B) Phenol novolac-type epoxy resin | | | 100.0 | 100.0 | 100.0 | 100.0 |
| (C) Curing agent | | | — | 40.2 | 40.3 | 40.0 |
| (D) Elastomer | | | 5.8 | 6.4 | 5.8 | 8.1 |
| (E) Liquid epoxy resin | | | 8.5 | 9.3 | 8.4 | 11.9 |
| (F) Filler | | | 223.2 | 245.1 | 221.2 | — |
| (G) Coupling agent | | | 1.8 | 2.0 | 1.8 | 2.5 |
| (H) Fluxing agent | | | 27.7 | — | 27.4 | 38.8 |
| (I) Curing accelerator | | | 13.8 | 15.2 | — | 19.4 |
| (J) Bisphenol A-type liquid | | | 27.7 | 30.4 | — | 38.8 |
| Total (parts by weight) | | | 446.4 | 490.2 | 442.5 | 312.5 |
| Film Characteristics | | Crack resistance | Good | Good | Good | Good |
| | | Surface flatness | Good | Good | Good | Good |
| Initial | Voids | C-SAM | 5/7 | 0/7 | 7/7 | 7/7 |
| | | Surface grinding | 2/2 | 0/2 | 2/2 | 2/2 |
| | Continuity | Resistance | 0/7 | 5/7 | 7/7 | 0/7 |
| Moisture Absorption | Voids | C-SAM | Not evaluated | Not evaluated | Not evaluated | Not evaluated |
| Resistance Reflow | Continuity | Resistance | Not evaluated | Not evaluated | Not evaluated | Not evaluated |

TABLE 3

| Material | Substance Name | Product Name | Manufacturer |
|---|---|---|---|
| (A) Film forming agent | Bisphenol F-type phenoxy resin | FX-316 | Nippon Steel & Sumikin Chemical Co., Ltd. |
| (B) Phenol novolac-type epoxy resin | Phenol novolac-type epoxy resin | YDPN638 | Nippon Steel & Sumikin Chemical Co., Ltd. |
| (C) Curing agent | Cresol novolac-type phenol | KA-1160 | DIC Corp. |
| (D) Elastomer | Butadiene-acrylonitrile-methacrylic acid copolymer | XER-32C | JSR Corp. |
| (E) Liquid epoxy resin | Liquid bisphenol A-bisphenol F epoxy resin | EXA835LV | DIC Corp. |
| (F) Filler | Silica (average particle diameter: 0.1 μm) | Sciqas | Sakai Chemical Industry Co., Ltd. |
| (G) Coupling agent | Phenylaminopropylsilane | KBM573 | Shin-Etsu Chemical Co., Ltd. |

TABLE 3-continued

| Material | Substance Name | Product Name | Manufacturer |
|---|---|---|---|
| (H) Fluxing agent | Oxyquinoline | — | Wako Pure Chemical Industries, Ltd. |
| (I) Curing accelerator | Microencapsulated modified imidazole | HX3088 | Asahi Kasei E-Materials Corp. |
| (J) Bisphenol A-type liquid epoxy resin | Bisphenol A-type liquid epoxy resin | — | Note: 2/3 of the weight thereof is contained in HX3088 curing accelerator (I) |

TABLE 4

| | Temperature at which the rate of temperature change of viscosity when temperature is increased according to a prescribed heating profile reaches 30 Pa · s/° C. |
|---|---|
| Example 1 | 245.6 |
| Example 2 | 246.7 |
| Example 3 | 247.1 |
| Example 4 | 247.5 |
| Example 5 | 245.5 |
| Example 6 | 242.2 |
| Comparative Example 1 | 243.3 |
| Comparative Example 2 | 245.5 |
| Comparative Example 3 | >257 |
| Comparative Example 4 | 251.6 |

TABLE 5

| Formulation (parts by weight) (based on 100 parts by weight of total amount of (b-1) and (b-2)) | | | Example 7 | Comparative Example 5 | Example 8 |
|---|---|---|---|---|---|
| (a) Film forming agent | | | 86.46 | 86.46 | 86.46 |
| (b-1) Acrylate compound 1 | | | 5.03 | 5.03 | 5.03 |
| (b-2) Acrylate compound 2 | | | 94.97 | 94.97 | 94.97 |
| (c-1) Curing agent 1 (Polymerization initiator 1) | | | 1.13 | 0.00 | 1.61 |
| (c-2) Curing agent 2 (Polymerization initiator 2) | | | 0.48 | 1.13 | 0.00 |
| (f) Filler | | | 134.60 | 134.60 | 134.60 |
| (g) Coupling agent | | | 1.13 | 1.13 | 1.13 |
| (H) Fluxing agent | | | 0.32 | 0.32 | 0.32 |
| Total (parts by weigh) | | | 324.12 | 323.64 | 324.12 |
| Film Characteristics | | Crack resistance | Good | Good | Good |
| | | Surface flatness | Good | Good | Good |
| Initial | Voids | C-SAM | 0/7 | 0/7 | 0/7 |
| | | Surface grinding | 0/2 | 0/2 | 0/2 |
| | Continuity | Resistance | 0/7 | 5/7 | 0/7 |
| Moisture absorption resistance reflow | Voids | C-SAM | 0/5 | Not evaluated | 0/5 |
| | Continuity | Resistance | 0/5 | Not evaluated | 0/5 |

TABLE 6

| Material | Substance Name | Product Name | Manufacturer |
|---|---|---|---|
| (A) Film forming agent | Acrylic-based polymer | Arfon UO-3080 | Toagosei Co., Ltd. |
| (b-1) Acrylate compound 1 | Polyester acrylate | M7100 | Toagosei Co., Ltd. |
| (b-2) Acrylate compound 2 | Dimethylol tricyclodecane diacrylate | DCP-A | Kyoeisha Chemical Co., Ltd. |
| (c-1) Curing agent 1 (polymerization initiator 1) | Organic peroxide | Percumyl D | NOF Corp. |
| (c-2) Curing agent 2 (polymerization initiator 2) | Organic peroxide | Perbutyl E | NOF Corp. |
| (f) Filler | Silica (average particle diameter: 0.1 μm) | Sciqas | Sakai Chemical Industry Co., Ltd. |
| (g) Coupling agent | Disilane coupling agent | KBM403 | Shin-Etsu Chemical Co., Ltd. |
| (H) Fluxing agent | Oxyquinoline | — | Wako Pure Chemical Industries, Ltd. |

TABLE 7

| | Temperature at which the rate of temperature change of viscosity when temperature is increased according to a prescribed heating profile reaches 30 Pa · s/° C. |
|---|---|
| Example 7 | 220.4 |
| Comparative Example 5 | 198.4 |
| Example 8 | 224.1 |

BRIEF DESCRIPTION OF THE REFERENCE SYMBOLS

10 Differential scanning calorimetry measuring device
20 Rheometer (viscoelasticity measuring device)
30 Computer
30A Image display device
30B Input device
31 Input/output bus
32 CPU
33 RAM
34 ROM
35 Input/output interface circuit
40 Simulation software
41 Reaction rate fitting mechanism
41A Fitting arithmetic processing mechanism
41B Fitting curve generation mechanism
41C Parameter calculation mechanism
42 Viscosity behavior fitting mechanism
42A Fitting arithmetic processing mechanism
42B Fitting curve generation mechanism
42C Parameter calculation mechanism
43 Virtual viscosity behavior calculation mechanism
43A Viscosity behavior arithmetic processing mechanism
43B Fitting curve generation mechanism

The invention claimed is:

1. A method of producing a film-like thermosetting resin composition for encapsulating a semiconductor that contains a thermosetting resin, a curing agent, a fluxing agent and a film forming agent, comprising:
 a step for selecting materials for a thermosetting resin composition containing a thermosetting resin, a curing agent, a fluxing agent and a film forming agent, and
 a step for mixing the materials for the thermosetting resin composition; wherein,
 the step for selecting materials for a thermosetting resin composition comprises the selection of materials for a thermosetting resin composition such that the temperature at which the rate of temperature change of viscosity when increased in temperature according to a prescribed heating profile reaches 30 Pa·s/° C. is 200° C. to 250° C., wherein
 the rate of temperature change of viscosity when increasing the temperature according to a prescribed heating profile is the rate of temperature change of viscosity obtained by a method of predicting viscosity behavior, and
 the method of predicting viscosity behavior comprises:
 a reaction rate measurement step for respectively measuring calorimetry peaks of the thermosetting resin composition at three or more rates of temperature increase,
 a viscosity behavior measurement step for respectively measuring viscosity behavior of the thermosetting resin composition at three or more rates of temperature increase,
 a reaction rate fitting step for fitting measurement data for each rate of temperature increase obtained in the reaction rate measurement step to a Kamal model formula, obtaining a fitting curve of calorimetry and time and a fitting curve of the calorimetry and temperature of the thermosetting resin composition for each of the rates of temperature increase, and calculating parameters in the Kamal model formula determined by the materials of the thermosetting resin composition,
 a viscosity behavior fitting step for fitting the parameters of the Kamal model formula calculated in the reaction rate fitting step and the measurement data for each of the rates of temperature increase obtained in the viscosity behavior measurement step to a Castro-Macosko model formula, obtaining a fitting a curve of viscosity and time and a fitting curve of viscosity and temperature of the thermosetting resin composition for each of the rates of temperature increase, and calculating parameters in the Castro-Macosko model formula determined by the materials of the thermosetting resin composition,
 a virtual viscosity behavior calculation step for calculating virtual viscosity behavior of the thermosetting resin composition for a prescribed heating profile by simulation based on each fitting curve for each of the rates of temperature increase obtained in the viscosity behavior fitting step, and
 a viscosity temperature change rate calculation step for calculating the rate of temperature change of viscosity of the thermosetting resin composition for a prescribed heating profile from virtual viscosity behavior of the thermosetting resin composition, and determining the temperature at which the rate of temperature change of viscosity becomes 30 Pa·sec/° C.,
 wherein the Kamal model formula used in the reaction rate fitting step is the modified Kamal model formula of the following Equation (2) in which the Kamal model formula of the following Equation (1) has been doubly superimposed:

$$\frac{\Delta\alpha(T)}{\Delta t} = \left(A_1 \exp\left(-\frac{E_1}{T+273.15}\right) + A_2 \exp\left(-\frac{E_2}{T+273.15}\right)\alpha(t)^m\right)(1-\alpha(t))^n \quad (1)$$

(wherein, A1, E1, A2, E2, m and n are parameters determined according to the materials of the thermosetting resin composition);

$$\frac{d\alpha(t)}{dt} = \left(A_1 \exp\left(-\frac{E_1}{T(t)}\right) + A_2\exp\left(-\frac{E_2}{T(t)}\right)\alpha(t)^m\right)(1-\alpha(t))^n \times \quad (2)$$
$$\frac{1}{1+\exp[T(t)-T_b]} + \left(B_1\exp\left(-\frac{F_1}{T(t)}\right) + B_2\exp\left(-\frac{F_2}{T(t)}\right)\alpha(t)^p\right)$$
$$(1-\alpha(t))^q \times \frac{1}{1+\exp[-(T(t)-T_b)]}$$

(wherein, A1, E1, A2, E2, m, n, B1, F1, B2, F2, p, q and Tb are parameters determined by the materials of the thermosetting resin composition),
 wherein the thermosetting resin composition contains 20 parts by weight to 120 parts by weight of a film forming agent, 30 parts by weight to 100 parts by weight of a curing agent, 3 parts by weight to 20 parts by weight old an elastomer, 5 parts by weight to 50 parts by weight of a liquid epoxy resin, 50 parts by weight to 1000 parts by weight of a filler, 1 part by weight to 10 parts by weight of a coupling agent, 5 parts by weight to 100 parts by weight of a fluxing agent, and 5 parts by weight to 100 parts by weight of a curing accelerator based on 100 parts by weight of the phenol novolac-type epoxy resin.

2. The method of producing a thermosetting resin composition according to claim 1, wherein the thermosetting resin is a phenol novolac-type epoxy resin and/or (meth) acrylate compound.

3. The method of producing a thermosetting resin composition according to claim 1, wherein the prescribed heating profile is a heating profile consisting of increasing the temperature from 145° C. to 258° C. in 6 seconds.

4. The method of producing a thermosetting resin composition according to claim 3, wherein the prescribed heating profile is a heating profile comprising increasing the temperature from 145° C. to 152° C. in 1 second followed by increasing the temperature from 152° C. to 253° C. in 4 seconds.

5. The method of producing a thermosetting resin composition according to claim 1, wherein the three or more rates of temperature increase comprise at least 2° C./min, 5° C./min and 10° C./min.

6. The method of producing a thermosetting resin composition according to claim 1, wherein the thermosetting resin composition further contains a film forming agent and at least one member of the group consisting of a curing accelerator, elastomer, filler and coupling agent.

7. The method of producing a thermosetting resin composition according to claim 1, the thermosetting resin composition further contains a liquid epoxy resin.

* * * * *